United States Patent [19]

Czubatyj et al.

[11] Patent Number: 4,782,340
[45] Date of Patent: Nov. 1, 1988

[54] ELECTRONIC ARRAYS HAVING THIN FILM LINE DRIVERS

[75] Inventors: Wolodymyr Czubatyj, Warren; Roger W. Pryor, Bloomfield Hills, both of Mich.

[73] Assignee: Energy Conversion Devices, Inc., Troy, Mich.

[21] Appl. No.: 899,442

[22] Filed: Aug. 22, 1986

[51] Int. Cl.$^4$ ............................................. G09G 3/34
[52] U.S. Cl. ........................... 340/825.830; 340/765; 340/825.810
[58] Field of Search ...................... 340/825.83, 825.85, 340/825.86, 825.94, 825.95, 825.96, 718, 765, 785, 771, 784, 825.82, 825.81

[56] References Cited

U.S. PATENT DOCUMENTS

| | | | |
|---|---|---|---|
| 3,392,373 | 7/1968 | Rouzier | 340/825.91 |
| 3,445,816 | 5/1969 | Polasek | 340/825.85 |
| 3,508,203 | 4/1970 | Waaben | 340/825.95 |
| 3,714,633 | 1/1973 | Epstein et al. | 340/825.94 |
| 3,715,634 | 2/1973 | Oushinsky | 357/2 |
| 4,403,217 | 9/1983 | Becker et al. | 340/718 |
| 4,447,812 | 5/1984 | Soneda et al. | 340/718 |
| 4,545,111 | 10/1985 | Johnson | 357/2 |
| 4,589,733 | 5/1986 | Yaniv et al. | 350/332 |
| 4,731,610 | 3/1988 | Baron et al. | 340/765 |

Primary Examiner—Donald J. Yusko
Attorney, Agent, or Firm—Richard M. Goldman; Marvin S. Siskind

[57] ABSTRACT

Fully integrated thin film electronic arrays including thin film line driver circuits and address decoding circuits are disclosed. Each line driver employs a two terminal thin film threshold switching device of the type exhibiting a negative resistance characteristic for very high speed, high current operation. The line drivers are particularly useful when driving address lines or other switched conductors in arrays having large capacitive loads or current requirements. The address decoding circuits are constructed from an array of thin film diodes configured as a plurality of AND logic gates, with the output of each AND gate providing the trigger signal to turn on a line driver circuit associated with a particular address line. Thin film structures used to implement the fully integrated arrays include diodes and threshold switches arranged as high density vertical devices in the form of multilayer mesa structures. An electronic memory array having a plurality of vertically arranged cells, with each cell provided with a thin film isolation diode and a thin film memory element, is also disclosed.

41 Claims, 18 Drawing Sheets

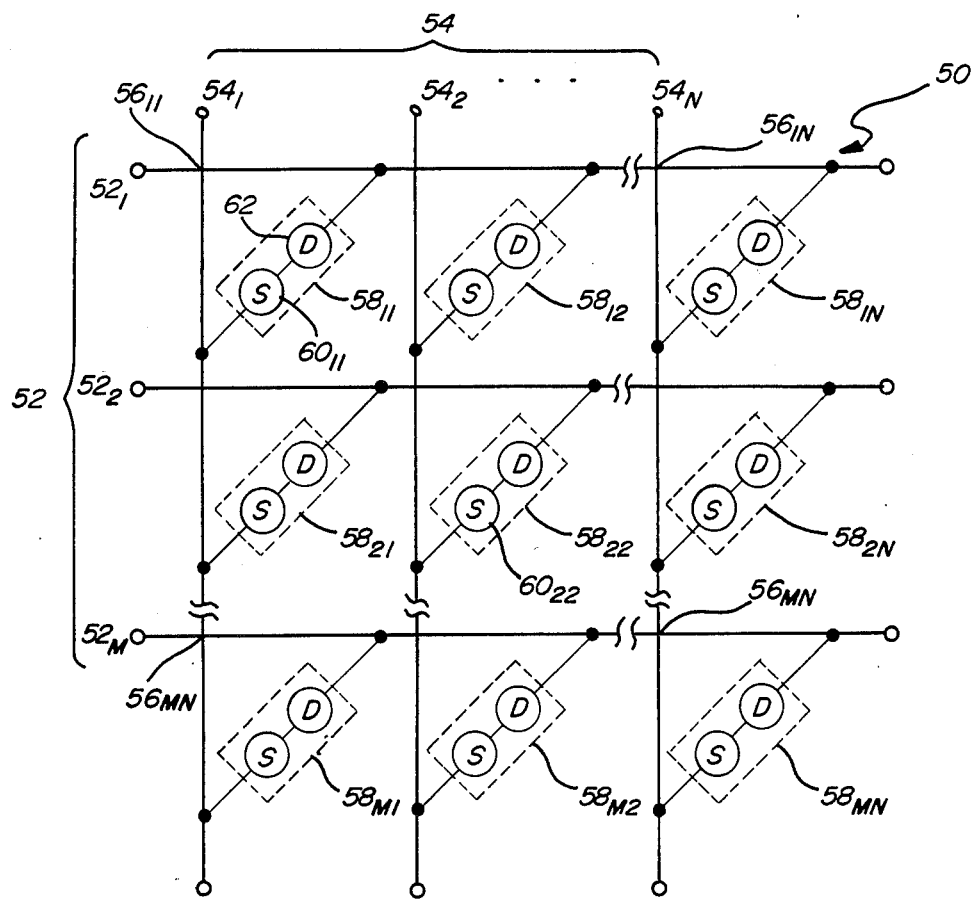
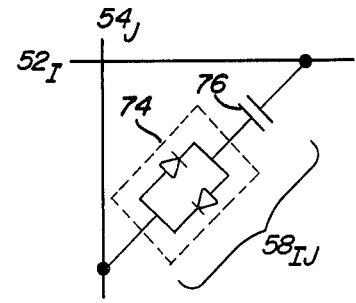 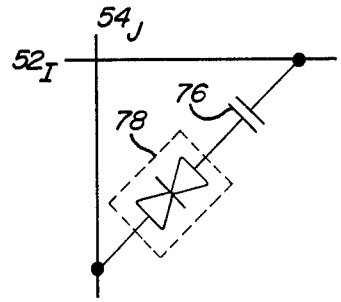 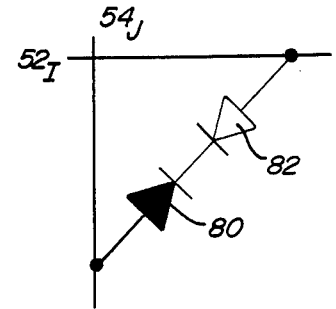
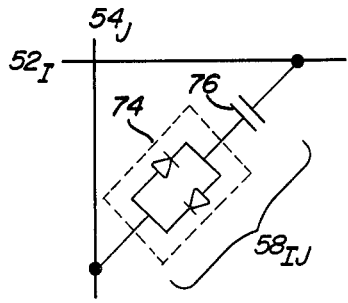 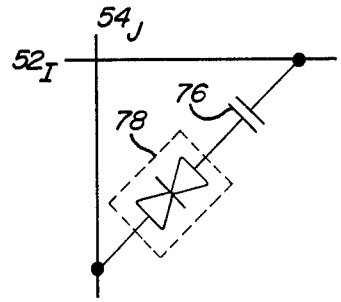 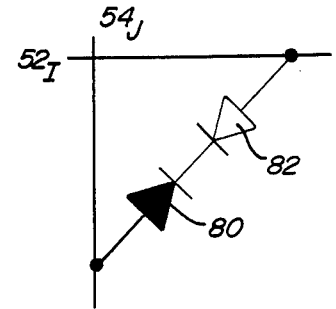

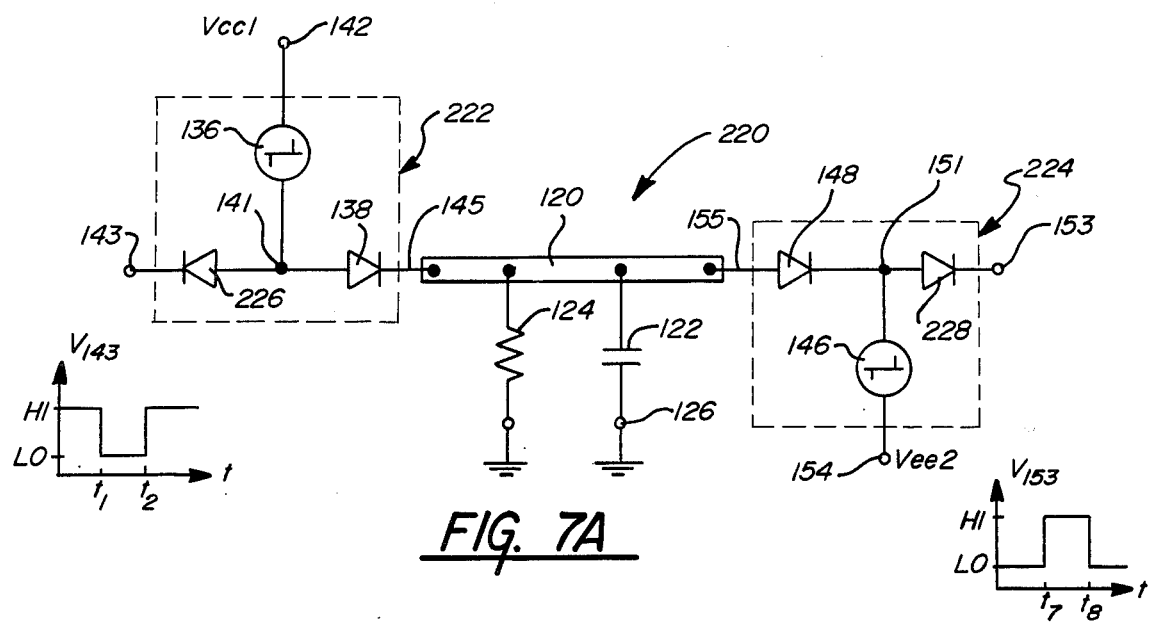
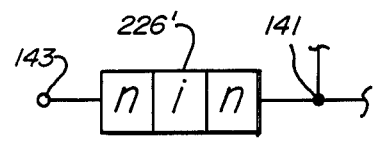
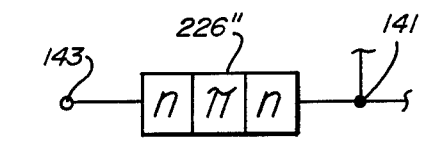
FIG. 7B
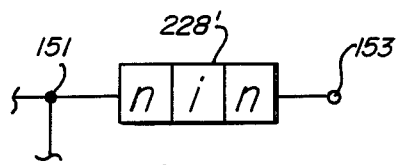
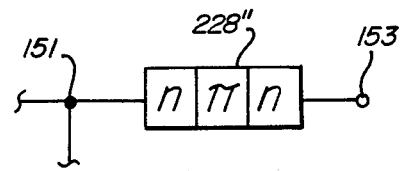
FIG. 7C
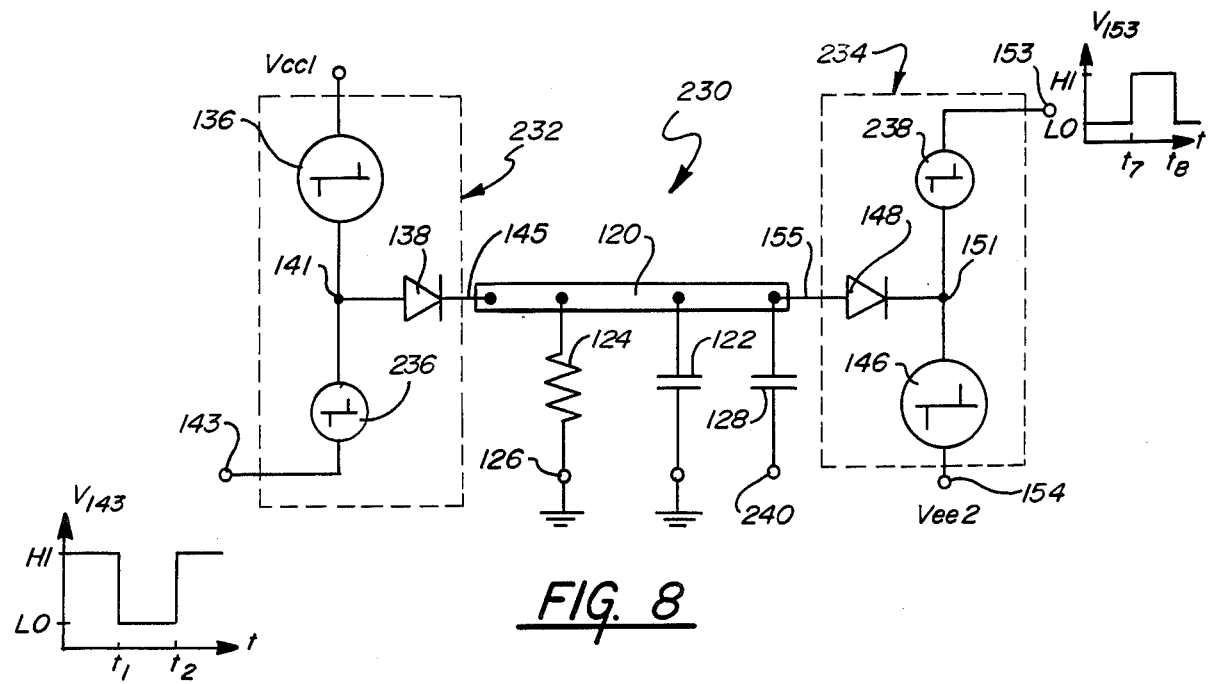
FIG. 8

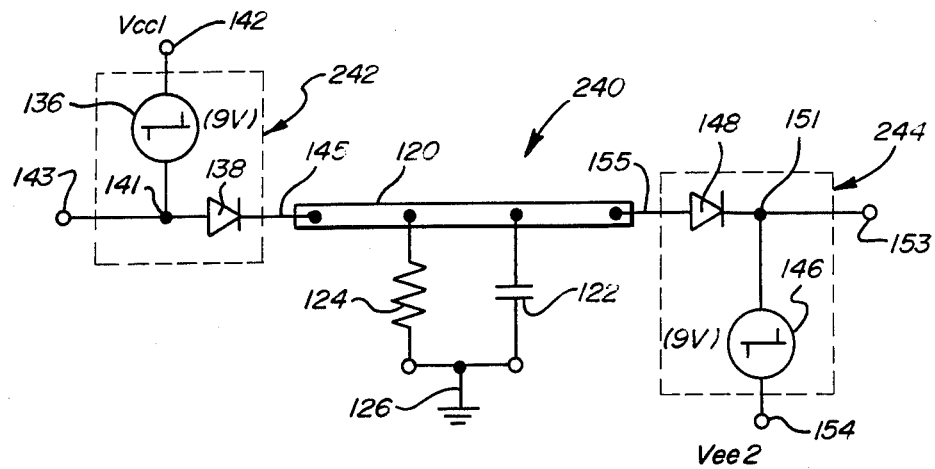
FIG. 9
FIG. 10A
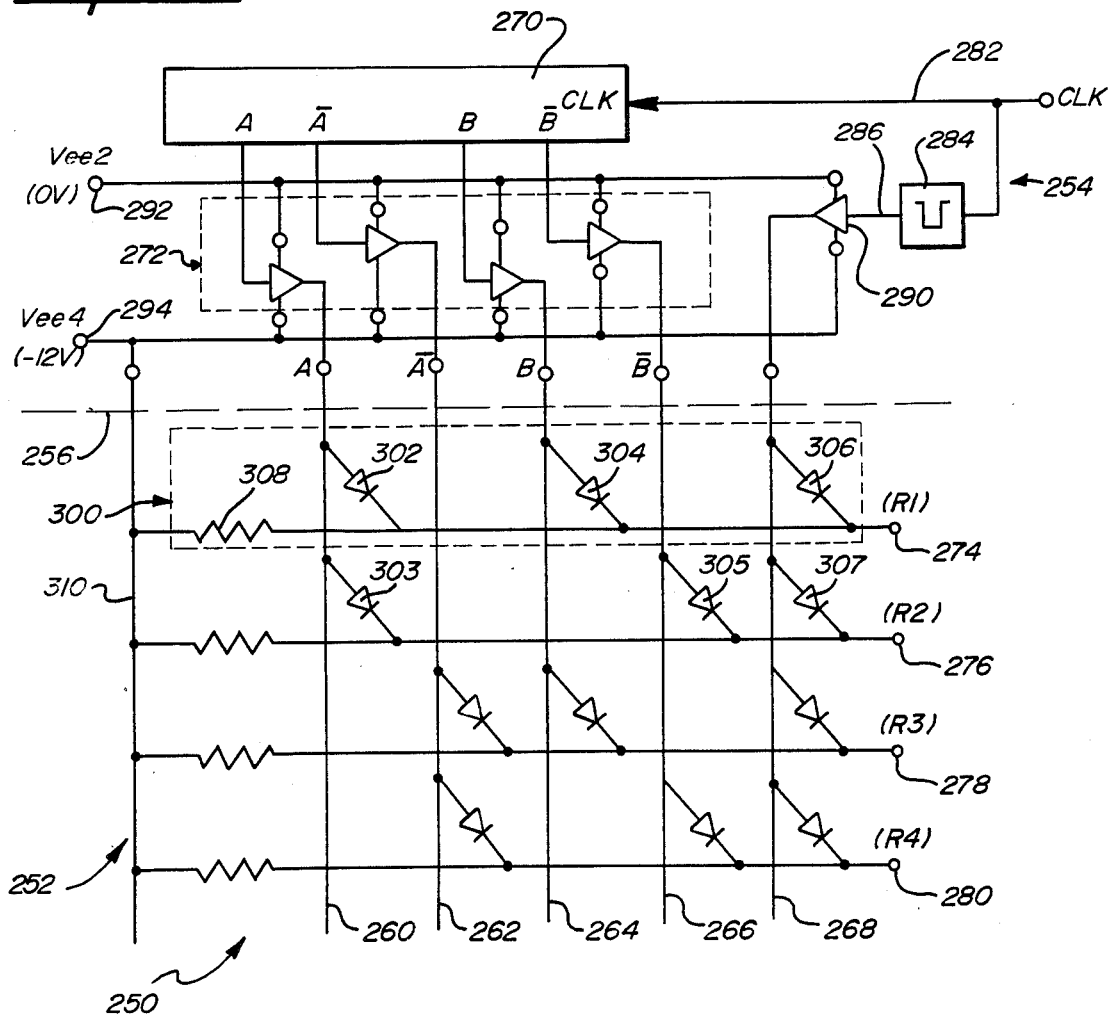

FIG. 10B
| ADDRESS INPUT LINES | | | | ROW SELECT LINES |
|---|---|---|---|---|
| A | B | $\bar{A}$ | $\bar{B}$ | |
| LO | LO | HI | HI | (R1) 274 |
| LO | HI | HI | LO | (R2) 276 |
| HI | LO | LO | HI | (R3) 278 |
| HI | HI | LO | LO | (R4) 280 |
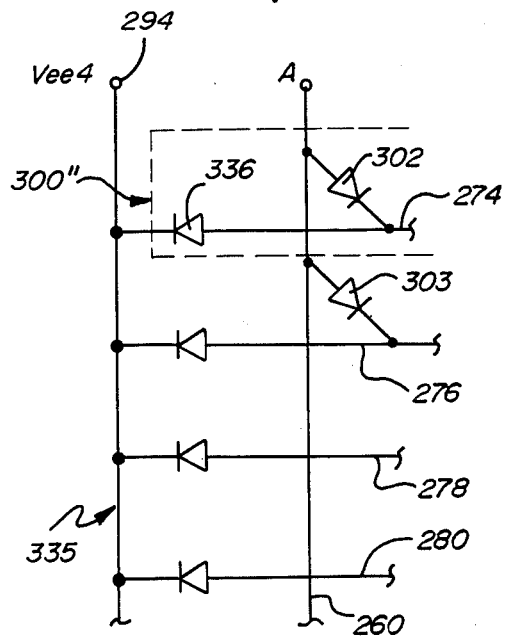
FIG. 10D
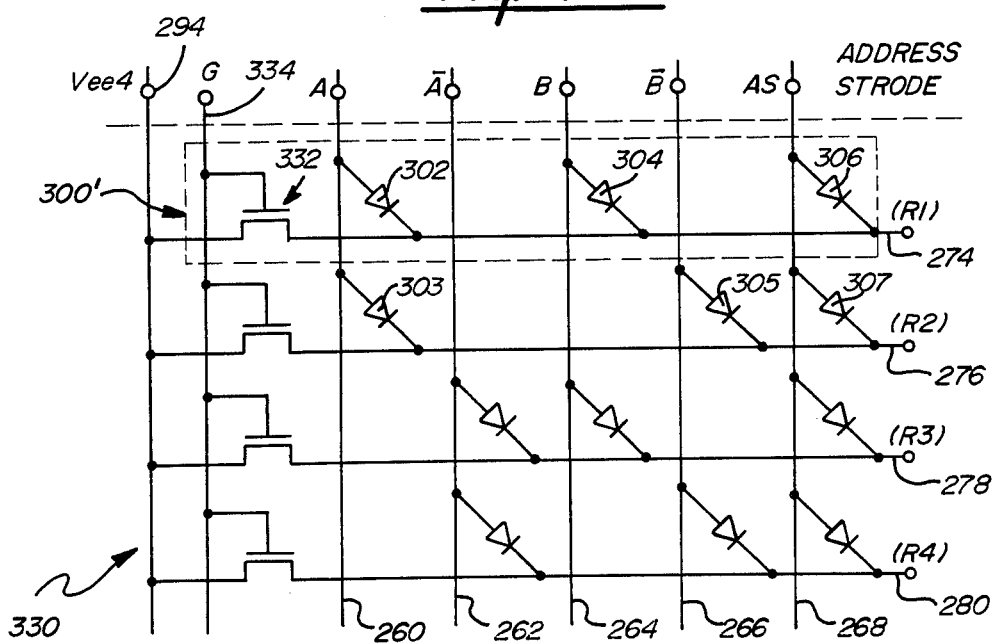
FIG. 10C

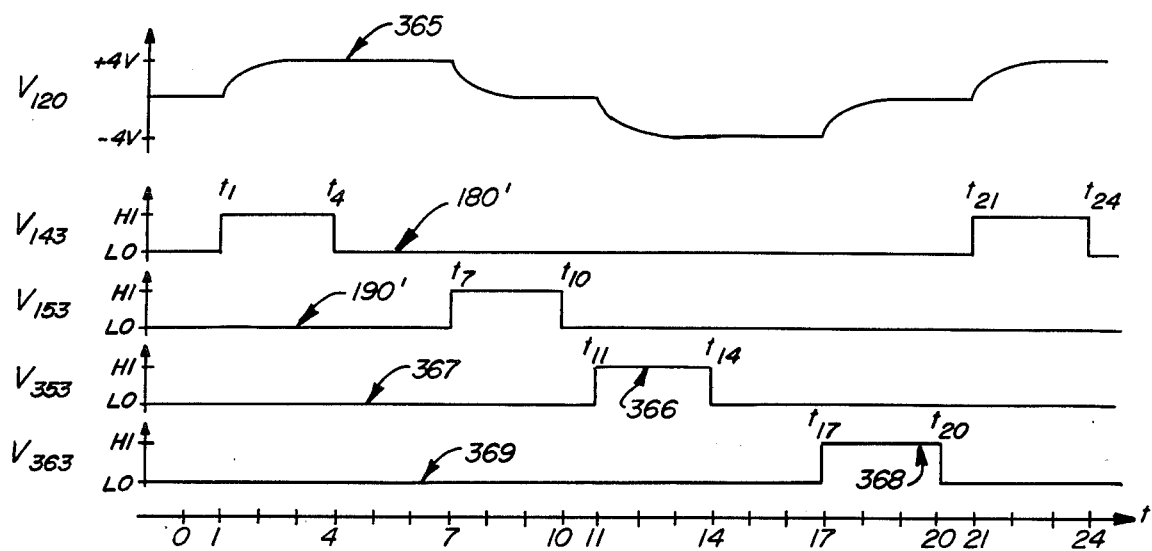
FIG. 12B
FIG. 12C
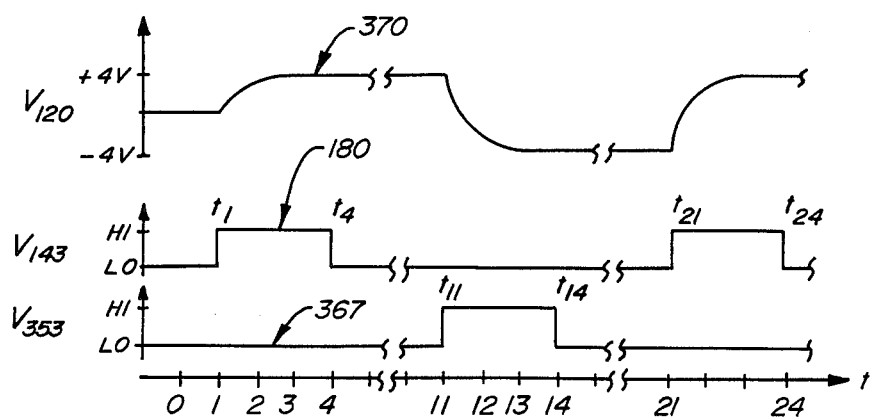

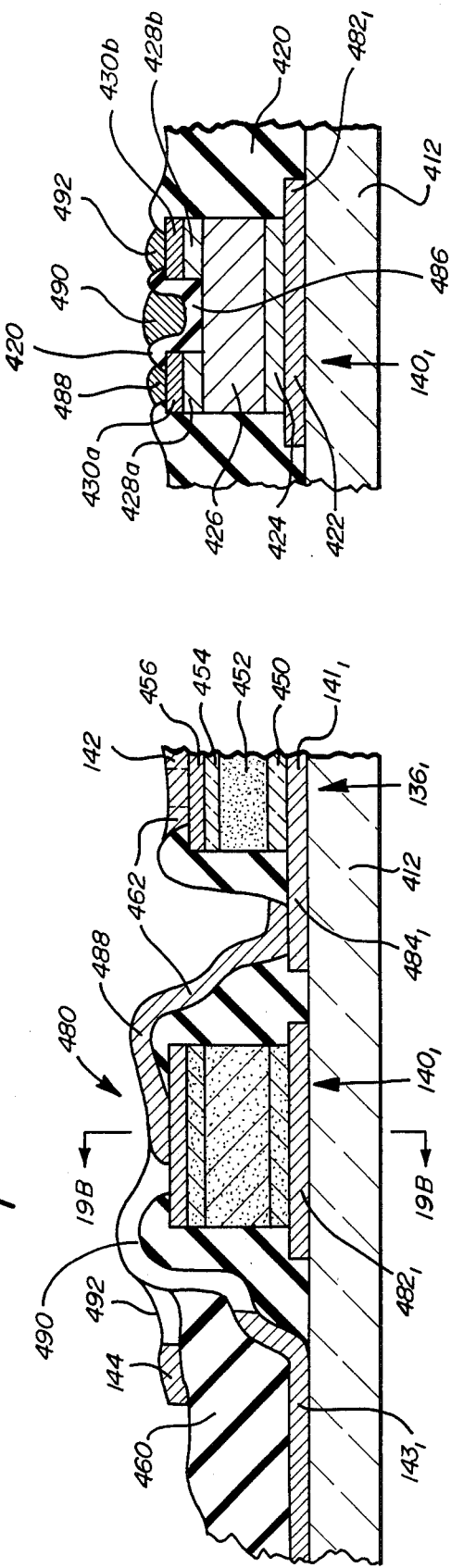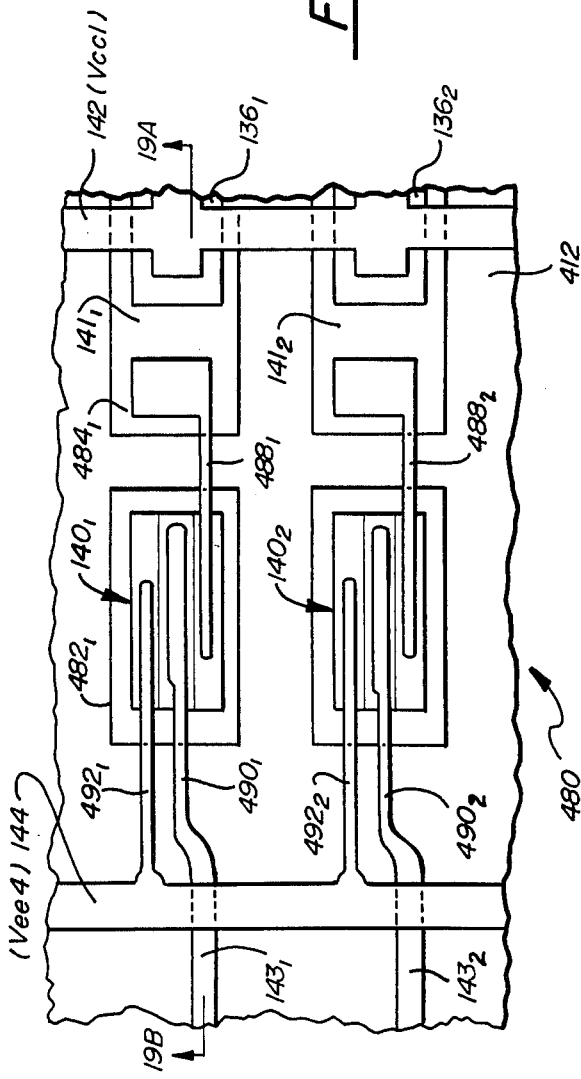

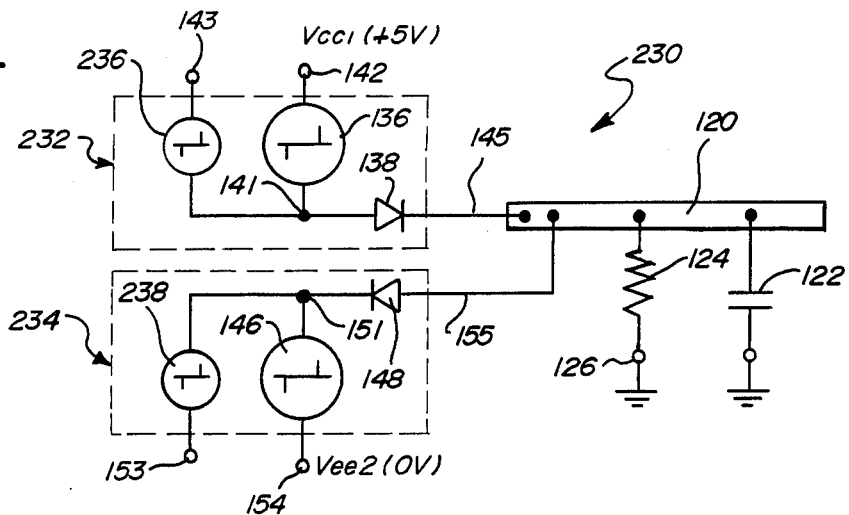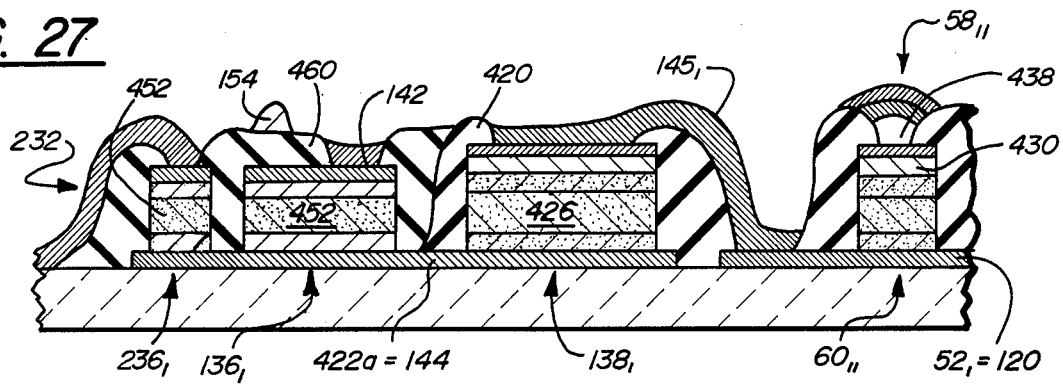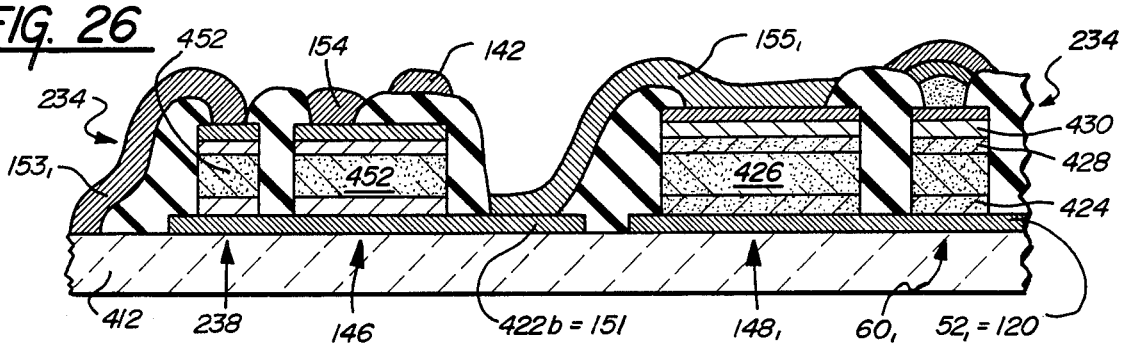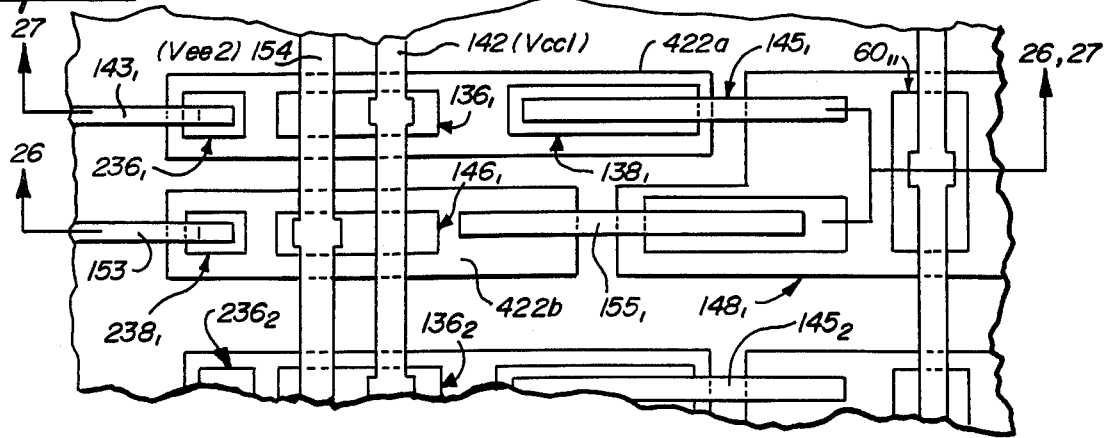

ELECTRONIC ARRAYS HAVING THIN FILM LINE DRIVERS

FIELD OF THE INVENTION

This invention relates in general to electronic arrays having line drivers integrally formed therewith, and to circuits used for such line drivers, and in particular to thin film integrated electronic arrays and thin film power switching devices and circuits used in such thin film arrays.

BACKGROUND OF THE INVENTION

Integrated electronic arrays are among the most important components in modern integrated electronics due to the wide number of functions which can be performed at an economic cost by such integrated arrays. In the crystalline semiconductor industry, the size of electronic arrays is limited to a fraction of the size of the single-crystal wafer with which crystalline semiconductor devices and circuits which form such arrays are fabricated. Although a crystalline silicon wafer upon which such arrays are fabricated may be between 3 and 8 inches in diameter, the entire wafer area cannot be used to fabricate just one or even a few very large integrated circuits or arrays, due to the well-known problem of defects in crystalline semiconductor devices, which reduces yields to zero percent as the size of the integrated circuit or array begins to approach a sizable function of the size of the crystalline wafer.

Thin film semiconductor material, devices and circuits which may be made using polycrystalline, microcrystalline or amorphous semiconductors or a combination thereof, do not have such inherent limitations. Such non-single-crystal semiconductor materials, like insulators and metals, are deposited as thin films by various techniques such as evaporation, sputtering or vapor deposition, and patterned to form many types of thin film integrated electronic devices, circuits, and arrays useful for a wide variety of applications. Thin film electronic structures may be fabricated over very large areas, making it possible to implement very large scale integration (VLSI) an ultra-large scale integration (ULSI) electronic circuitry, without the use of costly one micron or submicron geometries. Such circuits and arrays typically employ larger feature sizes, such as several microns to 20 microns or more, than do their single-crystal counterparts. Hence, thin films may be reliably deposited and patterned with greater ease and higher yields then their crystalline counterparts. The fabrication of thin film VLSI and ULSI circuits and arrays having large feature sizes is less expensive than the high resolution, high temperature processing which must be carried out in order to produce VLSI and ULSI electronic circuitry on crystalline wafers with acceptable yields.

A. Typical Thin Film Electronic Arrays

Several types of thin film electronic arrays are described and shown in FIGS. 1 through 3. FIG. 1 shows in schematic form an electronic array 50 which has a first set 52 of spaced apart conductors or address lines $52_1$ through $52_M$, and a second set of spaced apart conductors or address lines $54_1$ through $54_N$, where M and N are integers whose values may range from one to several hundred or one thousand or more. The first and second sets of address lines 52 and 54 are spaced apart from one another and may cross at an angle, typically at 90 degrees, so as to define an array of crossover points $56_{IJ}$, wherein I and J are integers whose values may range from 1 to M and N respectively. Electronic cells 58 are located at or adjacent to the crossover points 56, with one cell $58_{IJ}$ being associated with each corresponding crossover point $56_{IJ}$. Each cell 58 may include, for example, a single element, a pair of elements, an electronic circuit or circuits, a signal conditioning unit, a memory unit or the like. Typically, cell $58_{IJ}$ is accessed or addressed by appropriate signals, which may be voltage or current waveforms of varying amplitudes applied substantially simultaneously to conductors $52_I$ and $54_J$. Depending upon the nature of the array 50 and the individual cells 58, the cells 58 may receive and store information present in the applied signals, or may alter the applied signals so as to impart information to the applied signals, which imparted information may then be subsequently processed within or outside the array.

As shown in FIG. 1, the cells 58 often each contain a pair of elements such as selection or isolation means 60, for ensuring that the signals or waveforms applied to selected address lines 52 and 54 interact only with the intended cell or cells to be accessed or addressed, and information-bearing means 62. By "information-bearing means" is meant any means known or hereafter created for receiving or storing information present in the applied signals or waveforms, or for imparting information to the applied signals or waveforms. The information may be in digital form such as a binary value, e.g., logical "one" or logical "zero", or in analog value such as a "gray-scale" value, or any other electrically detectable form. The information may, for example, be encoded into the cell at the time of manufacture, or programmed into or otherwise acquired by the cell at any time thereafter, depending upon the type of cell. Many of different circuits, devices, or structures may be utilized to implement the selection or isolation function of means 60. Similarly, many different circuits, devices, or structures may be utilized as the information-bearing means 62. For convenience, means 60 and 62 will often be generally referred to hereafter as isolation device 60 and information device 62, respectively.

FIGS. 2A through 2H provide examples of some of the different forms that a typical cell $58_{IJ}$, isolation device $60_{IJ}$ and information-bearing device $62_{IJ}$ in an electronic array 50 may take. FIG. 2A is illustrates of a typical cell 58 in an electroluminescent array which includes an isolation device $60_{IJ}$ and a light emitting device $62_{IJ}$. One such thin film array is disclosed in U.S. Pat. No. 3,708,717 to G. Fleming. It discloses the use of an electroluminescent material in series with a two terminal threshold switching device, commonly called an Ovonic threshold switch, and preferably of the type disclosed in U.S. Pat. No. 3,271,591 to S. R. Ovshinsky. The traditional circuit symbol for an Ovonic threshold switch is shown in FIG. 1B at reference numeral 66.

FIG. 2B illustrates a typical cell 58 in a thin film electronic memory matrix array, which may be of the type disclosed in U.S. Pat. No. 3,573,757 to R. Adams. The FIG. 2B cell shows an Ovonic threshold switch 66 in series with bi-stable semiconductor memory material 68, which is switchable between a high resistance and low resistance condition by the application of suitable waveforms to cause phase change within the semiconductor material. The semiconductor material is preferably of the memory type disclosed in the aforementioned U.S. Pat. No. 3,271,591.

FIG. 2C illustrates a typical cell used in an integrated thin film memory array of the type disclosed in U.S. Pat. No. 4,545,111 to R. Johnson. The diode 72, which serves as the isolation device $60_{IJ}$, is shown therein formed of three stacked layers of amorphous silicon alloy semiconductor material arranged in a p-i-n diode configuration. The memory switch 68 is formed on top of the amorphous silicon alloy layers by depositing a film of semiconductor memory material.

FIG. 2D illustrates a typical cell used in a light influencing flat panel display made from thin film materials, which may be of the type disclosed in U.S. patent applications Ser. Nos. 573,004 and 675,941 filed on Jan. 23, 1984 and Dec. 3, 1984, respectively, in the names of Z. Yaniv, et al and entitled "Liquid Crystal Displays Operated By Amorphous Silicon Alloy Diodes". The isolation device $60_{IJ}$ is shown to be formed of a ring diode structure 74, which in its simplest form consists of a pair of diodes connected in parallel with one another as shown. The pair of picture element electrodes used to apply a field to the light influencing material are shown as a capacitor 76. In flat panel displays, typically the address line $54_J$, isolation device $60_{IJ}$, and one electrode of pixel 76 are located on a first substrate, while the address line $52_I$ and the other electrode of pixel 76 is located on a second substrated spaced from the first substrate.

FIG. 2E shows an exemplary cell utilized in a light influencing display employing thin film nonlinear devices, such as device 78, as the isolation devices $60_{IJ}$, and a picture element 76 which takes the form of a pair of spaced apart electrodes. Such nonlinear elements may be formed using n-i-n (or p-i-p) structures as disclosed in U.S. patent application Ser. No. 679,770 filed Dec. 10, 1984 in the names of W. DenBoer et al, and entitled "Programmable Semiconductor Switch For A Display Matrix Or The Like And Method For Making Same". Alternatively, the devices 78 may be formed as n-pi-n (or p-nu-p) threshold devices as disclosed in U.S. patent application Ser. No. 720,767 filed Apr. 8, 1985 in the name of S. Guha and entitled "Solid State Threshold Devices Using Punch-Through".

FIG. 2F illustrates a typical cell used in a thin film photosensitive array for producing electrical signals representative of an image or detectable surface conditions projected onto or otherwise optically provided to photosensitive elements within the array. Typically, each such cell includes an isolation device $58_{IJ}$ such as diode 80 in series with photosensitive element 82 which may be a photoresistor, a photosensitive diode or a miniature solar cell device such as p-i-n diode. Several such arrays are disclosed in U.S. patent application Ser. No. 607,153 filed May 4, 1984 in the names of V. Cannella, et al and entitled "Contact-Type Document Scanner And Method".

FIG. 2G illustrates a typical cell $58_{IJ}$ in thin film electronic displays which do not utilize a separately formed isolation device 60 in each cell. Such displays, which are often formed as matrix arrays, instead rely upon the nonlinear electro-optical characteristics of the light influencing material, for example nematic liquid crystal material, to be able to selectively and periodically apply distinct signals to individual pixel elements such as pixel 76.

FIG. 2H illustrates a typical photosensitive cell used in an imaging array which does not employ a selection means or isolation device 60 with each cell. Such an imaging array is disclosed, for example, in aforementioned U.S. Pat. No. 4,545,111.

Other electronic arrays utilize three terminal devices as a selection means or isolation device to ensure that waveforms applied to selected address lines access intended cells, as illustrated in FIGS. 3A through 3C, and may also be used for a wide variety of purposes.

FIG. 3A depicts one generic array 90 which utilizes such three terminal isolation devices. The array 90 includes a first set of address lines 52 and a second set of address lines 54 which cross at an angle with respect to the address lines of the first set so as to form crossover points 56 as in array 50 shown in FIG. 1. For convenience only a pair of address lines 52 and 54 are shown, although, if desired, many more can be provided. The electronic array 90 also includes a third set of address lines 92 which are generally disposed adjacent to but spaced apart from corresponding address lines 52 of the first set. Each cell of array 90 such as cell $94_{11}$ includes a three terminal selection means or isolation device 96 which is electrically connected to an information-bearing means or device 62, and to an associated conductor from the third set of address lines as illustrated by connecting line 98.

FIG. 3B illustrates a typical cell $94_{IJ}$ in an array 90 used for an active matrix light influencing display, which may be of the type fully described in U.S. patent application Ser. No. 702,996 filed Feb. 19, 1985 in the names of Z. Yaniv, et al and entitled "Active Display Matrix Addressable Without Crossed Lines On Any One Substrate And Method Of Using The Same". There, three terminal isolation device 96 is shown as a field effect transistor 102 with a picture element 76 connected to its source (or drain).

FIG. 3C illustrates another electronic matrix array 110 which uses a three terminal structure or circuit as an isolation device. The array 110 has a typical cell 112 which includes an isolation device 114 formed by at least a pair of diodes arranged in series between selected address lines from the first and third sets of address lines 52 and 92. The third terminal 116 of device 114 is connected to a picture element 76 which has its other electrode connected to one member of the second set of address lines 54. Such thin film array structures are fully described as light influencing display, in the aforementioned patent applications Ser. Nos. 573,004 and 675,941, and as random access memories in U.S. patent application Ser. No. 708,355 filed Mar. 4, 1985 in the names of Z. Yaniv, et al and entitled "Random Access Memory".

Electronic arrays may also have more than three sets of address lines and more than one isolation device per cell. An example of same is provided by U.S. Pat. No. 4,589,733 to Z. Yaniv et al.

The foregoing examples of thin film electronic arrays illustrate some of the many different types of thin film electronic arrays to which the present invention may be applied. The examples also illustrate the applicability of thin film technology to electronic arrays in the fields of electronic memories, flat panel displays, imaging systems, and the like. All of the aforementioned patents and applications are hereby incorporated by reference herein, since they illustrate such electronic arrays and describe how such arrays may be fabricated utilizing thin film technology in various types of semiconductor materials.

B. The Problem of Fully Integrating Thin Film Arrays

Those building thin film electronic arrays of various types have long desired to fully integrate the circuitry performing the addressing function, including the driving of address lines and any addressing circuitry such as address decoding, with the electronic array being serviced by such circuitry. Full integration, that is, the fabrication of the address decoding and line driving circuitry on the same substrate with the electronic matrix using thin film semiconductor processing techniques, is expected to lower the over-all manufacturing cost and reduce the size of such arrays, while at the same time improving their reliability. One important technical problem blocking such full integration and which has heretofore not been satisfactorily overcome is the relatively low power capability of most thin film devices, particularly their low current capability. In electronic arrays, particularly very large arrays having many locations or programmable cells connected to one conductor or address line, relatively high amounts of current must be passed to and/or from such lines in a relatively short period of time, especially at the beginning or end of an access cycle for an individual address line. A typical 640 column by 400 row thin film liquid crystal display matrix used as a television, for example, and refreshed at 60 Hertz must update 24,000 rows per second, or one row every 40 microseconds. Commercially acceptable solid-state memories, such as random access memories (RAMs) or electrically erasable programmable read only memories (EEPROMs), require line access cycle times that are typically one to three orders of magnitude faster. As the number of cells connected to one line increases, the capacitance and current requirements of that line increase, exacerbating the foregoing current and speed problems.

Typical thin film transistors made of amorphous silicon alloys, for example, have low electron and hole mobilities and cannot provide sufficiently high currents. Although some other thin film semiconductor materials used at times to make thin film circuitry have somewhat higher mobilities, these mobility values still far less than those of crystalline silicon semiconductors. Moreover, conventional non-crystalline field effect transistors (FETs) typically are unipolar devices which suffer from space charge limited conduction and the self-screening effect of trapped charge. For many applications such FETs have unacceptably slow turn on and turn off times. Simply stated, in most electronic array applications, thin film devices like unipolar FETs, when constructed in practical sizes, are unable to supply enough current to charge or discharge the address lines and the cells and capacitive loads connected thereto within the time periods necessary to achieve the desired high speed operation. These problems have generally precluded the application of such thin film transistor devices as power switching or line driving devices in practical thin film electronic matrix arrays.

C. Threshold Switching Devices

Threshold switching devices, such as those first invented by S. R. Ovshinsky, may be generally described for the purposes used herein as a switching device which has a negative resistance characteristic, including a threshold voltage and a minimum holding current. Specifically, the device includes a semiconductor material and at least a pair of electrodes in contact therewith, wherein the semiconductor material has a threshold voltage value and a high electical resistance to provide a blocking condition for substantially blocking current therethrough, and wherein the high electrical resistance in response to a voltage above the threshold voltage value very rapidly decreases in at least one path between the electrodes to a low electical resistance which is orders of magnitude lower than the high electical resistance, which provides a conducting condition or path for conducting current through the semiconductor material. The conducting condition or path is maintained in the device so long as at least a minimum holding current continues to pass through the conducting path within the device. When the current falls below this minimum current value, the device rapidly reverts to its high resistance blocking condition. The voltage drop across the semiconductor material in a threshold switch when in its conducting condition is a fraction of the voltage drop across the material when in its high electrical resistance blocking condition, as measured near the threshold voltage value of the switch.

Many different combinations of atomic elements when combined in the proper proportions and manner have been shown to produce a semiconductor material having the aforementioned threshold switching action. Examples of such materials and threshold switching devices made therewith are found in the following list of U.S. patents, which are hereby incorporated by reference herein:

3,271,591
3,571,671
3,343,034
3,571,672
3,571,669
3,588,638
3,571,670
3,611,063

Threshold switches have been employed as isolation devices within the individual cell of various types of electronic arrays such as those described in U.S. patents mentioned above with respect to FIGS. 2A and 2B. These patents, however, do not disclose or suggest the use of threshold switching devices as line drivers for such arrays.

Many studies have been conducted to characterize the nature and speed of the threshold switching phenomenon and to determine threshold device characteristics in order to allow the threshold switch to be reliably used a circuit element. See, for example, J. Perschy, "On The Threshold Of Success, Glass Semiconductor Circuits", Electronics, pp. 74–84 (July 24, 1967); three articles in Journal Of Non-crystalline Solids (1970), namely (1) R. Shanks, "Ovonic Threshold Switching Characteristics" at pp. 505–514, (2) T. Kobylarz, "Several Circuit Applications of Amorphous Semiconductors" at pp. 515–527, and (3) D. Nelson, "Ovonic Device Applications" at pp. 528–539; and "Circuit Applications of Ovonic Switching Devices", IEEE Transactions On Electron Devices, Vol. ED-20 pp. 178–187 (Feb. 1973). Of these five articles, only the first discloses or suggests the use of threshold switching devices as part of line driving circuits used in conjunction with memories. Specifically, it discloses the experimental use of threshold switching devices as switches for supplying current to wires used for setting and sensing conventional ferrite core magnetic memories arranged in a rectangular plane array. Each wire is threaded through multiple ferrite cores and is capable of carrying half-select currents provided through the threshold switches. Two orthogonally arranged half-select wires or lines pass through and effectively locate each core. Other threshold switches are also used as part of the addressing circuitry. The disclosed current-supplying and addressing circuitry relies exclusively upon external separately constructed and controlled current sources to turn off the threshold switching devices therein once they have been turned on.

Threshold switches are generally configured as two terminal devices. Since they exhibit symmetrical current-voltage (I-V) characteristics, have been applied typically in alternating current applications. They are ambipolar devices, that is the currents in the conduction path or paths therein consists of both holes and electrons. They can have extremely high current densities. If driven properly, threshold switches can have extremely fast switching speeds, such as into the nanosecond region and below, and make excellent surge suppression devices. Typically, a threshold switch is constructed of a thin film of preferably amorphous semiconductor material, and may be described as a semiconducting glass, although there are a number of other forms of threshold switches such as those described in U.S. Pat. No. 3,715,634 to S. R. Ovshinsky.

Two terminal threshold devices, once turned on, cannot be turned off, except by reducing the voltage across the device below its minimum holding current for the requisite period of time, which is typically well under one microsecond. These two terminal devices lack a control terminal or region, such as the gate found in FETs or the base found in bipolar junction transistors, that can be used to shut off the devices once they have been turned on. Thus, such a threshold switching device cannot be used by itself as a direct current (DC) switching or linear amplification device like a transistor can.

SUMMARY OF THE INVENTION

In one aspect of the present invention, there is provided, for use in electronic arrays, several embodiments of line driver circuits, each of which use one or more threshold switching devices. They are particularly useful for driving conductors or lines in an array which are switched from one voltage level to another and have high capacitive loads or current requirements. One such embodiment is an electronic array having multiple locations arranged to be repetitively accessed, comprising: at least a first conductor electrically connected to at least a first set of said multiple locations having at least two such locations; and line driver means, including at least a first integrated thin film threshold switching device having a negative resistance characteristic and switchable between a high resistance off state and the relatively low resistance on state, for changing an electrical condition, such as the voltage, of said first conductor from a first nominal level to a second nominal level when said device is switched from its off state to its on state by a trigger event. The switch means is arranged such that the device automatically switches from its off state to its on state when the trigger event is over and the second nominal level has been achieved. The line driver means may also include isolation means, such as a rectifying junction, contained in a diode, electrically connected between the common conductor and the threshold switching device, for inhibiting the flow of current in at least one direction therebetween at least when the threshold switching device is in its off state. The line driver means may also include trigger means for providing the trigger event to the threshold switching device in response to at least one control signal received by the trigger means. The trigger means may be a thin film device, such as a transistor, capacitor, a second threshold switching device or two terminal non-linear device such as a diode, integrally formed with the threshold switching device above a common substrate.

The present invention also provides a method of operating a threshold switch circuit, which includes at least one threshold switch, to change the nominal voltage of a conductor in an electronic array having multiple locations from a first nominal level to a second nominal level, comprising the steps of: providing a trigger signal to the threshold switch to change it from its high resistance off state to its relatively low resistance on state so as to cause the flow of current through the switch and thereby cause the electrical condition to change from the first level to the second level; and ending the trigger signal before the first level must be re-established. The trigger signal may be ended before, or maintained until after the second level is achieved. In particular it may be maintained for a period of time longer than the period of time required for a typical access cycle to one of the multiple locations in the array. The trigger signal may be a single continuous pulse, or a wave form including multiple pulses.

In a second aspect of the present invention, there is provided several embodiments of integrated thin film logic arrays, which are particularly useful for creating combinational logic circuits, addressing circuits, and the like which may be used, for example, to decode digital addresses or otherwise process input signals in order to provide trigger signals to power switching devices and circuits, such as the line driver circuits of the present invention. One such embodiment is an integrated thin film logic array, comprising: first, second and third thin film devices formed as distinct mesa structures from a common multiple layer thin film structure, said first and second devices each being arranged to have a substantially vertical conduction path therethrough, and the third device being arranged to function as an element which is significantly more resistive than the lowest resistance values of said first and second devices; and first conductive means for electrically interconnecting the first, second and third devices to form a first logic circuit. The third device may be a transistor, or a rectifying device, such as a diode. The third device may also be arranged to have a substantially vertical conduction path therethrough. The logic array may be combined with an electronic array having at least a first conductor and multiple locations connected to the first conductor and a accessible therethrough, and the logic circuits may be arranged for providing, in response to at least one input signal received by it, an output signal indicating when the first conductor is being selected so as to allow access to at least one of the multiple locations associated therewith.

In a third aspect of the present invention, there is provided an electronic memory array formed from thin film materials.

Such an array may comprise: a plurality of the electrically accessible memory cells, each memory cell including a thin film two terminal vertical isolation device and a thin film body of memory material vertically displaced with respect to one another, each such isolation device being formed as a distinct multilayer mesa structure horizontally separated from all other such mesa structures, and each said body being formed as a distinct memory element in direct electrical contact with its respective isolation device and horizontally separated from all other such memory elements; and insulation means for substantially electrically insulating each cell from all other horizontally adjacent cells. The isolation devices and the bodies are preferably sized such that the ratio of the effective cross-sectional current-conducting area of each isolation device to the total cross-sectional area of its respective body of memory material is over 10, and preferably at least 40.

By combining the thin film logic arrays and line driver circuits of the present invention with a prior art thin film electronic array, a fully integrated thin film electronic array may be formed. The devices used in all three aspects of the present invention are preferably vertical devices made of stacked multiple layers of thin film material, for ease of fabrication and to achieve high packing densities.

BRIEF DESCRIPTION OF THE DRAWINGS

FIG. 1 is an electronic schematic diagram of a prior art electronic matrix array having a plurality of individually accessable or addressable cells;

FIGS. 2A through 2H are each a schematic diagram of a representative cell of different types of prior art thin film electronic arrays having two sets of address lines and utilizing two terminal isolation devices.

FIG. 7A shows two line driver circuits of the present invention each using a threshold switch and a nonlinear device, namely a diode; and FIGS. 7B and 7C show alternative nonlinear devices which may be used in FIG. 7A.

FIG. 8 shows two line driver circuits of the present invention each using a pair of threshold switches.

FIG. 9 shows two line driver circuits of the present invention each having a threshold switch connected directly to an input terminal.

FIG. 10A is a schematic diagram of an array of diode logic gates and associated address input circuitry useful for providing input signals to the line driver circuits of the present invention; FIG. 10B is a truth table for the FIG. 10A; FIG. 10C is an alternate embodiment for the diode addressing array of FIG. 10A which uses transistors as active resistive elements; and FIG. 10D is yet another embodiment of the diode addressing array of FIG. 10A which uses diodes as active resistive elements.

FIG. 12B is a timing diagram for FIG. 12A; and FIG. 12C is a alternate timing diagram for FIG. 12A.

FIGS. 13 through 17 are various views of an exemplary integrated electronic memory array of the present invention utilizing the line driver circuits of FIG. 7A, wherein:

FIG. 13 shows a first partially completed structure in plan view, and FIG. 14 is a cross-sectional side view taken along line 14—14 of FIG. 12;

FIG. 15 is a cross-sectional side view of the structure of FIG. 14 after more fabrication steps have been performed; and FIG. 16 is a plan view of the completed structure, and FIG. 17 is a cross-sectional side view taken along line 17—17 of FIG. 16.

FIGS. 18, 19A and 19B are partial plan, side and end views of a thin film structure embodying corresponding to a line driver circuit of FIG. 4, with FIGS. 19A and 19B being taken in cross-section along line 19A—19A of FIG. 18 and line 19B—19B of FIG. 18 respectively.

FIG. 24 is a re-arranged schematic diagram of the line driver circuits shown in FIG. 8.

FIGS. 25, 26 and 27 are a plan and two side views showing a thin film structure implementing the line driver circuits of FIG. 24, with FIGS. 26 and 27 being taken in cross-section along lines 26—26 and 27—27 of FIG. 25 respectively.

DETAILED DESCRIPTION OF THE PREFERRED EMBODIMENTS

The detailed description is generally organized as follows: several line driver circuits of the present invention are described. Next, two address decoding circuits each made of an array of diodes are described. Thereafter, integrated thin structures for implementing an electronic memory aray and the line driver circuits of the present invention are described. The final Figure shows in block diagram form a fully integrated thin film electronic array having a matrix array of addressable cells, and two sets or arrays of line driver circuits and address decoding circuits, all formed on the same substrate.

I. Basic Line Driver Circuits

Figure 2G:
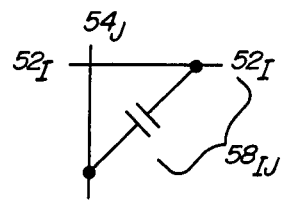
Figure 2H:
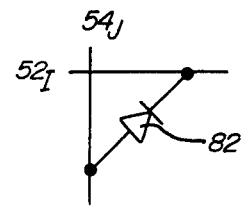
Figure 3A:
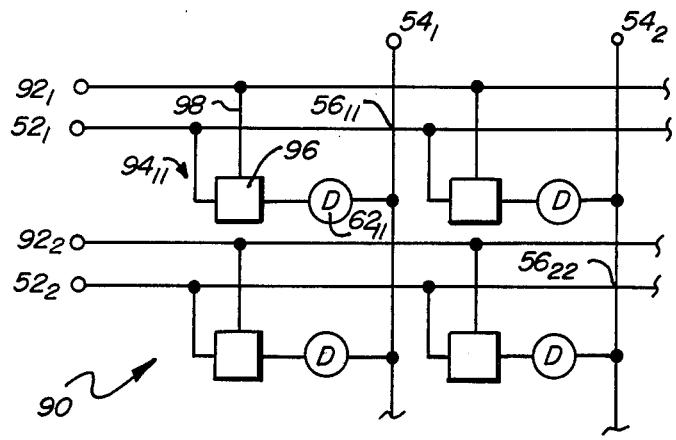
FIGS. 3A through 3C are schematic diagrams illustrating different types of prior art thin film electronic arrays having three sets of address lines and utilizing three terminal isolation devices.
Figure 3B:
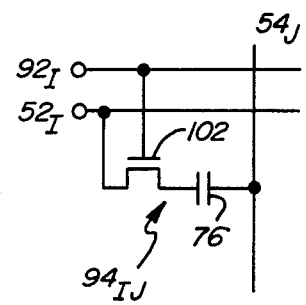
Figure 3C:
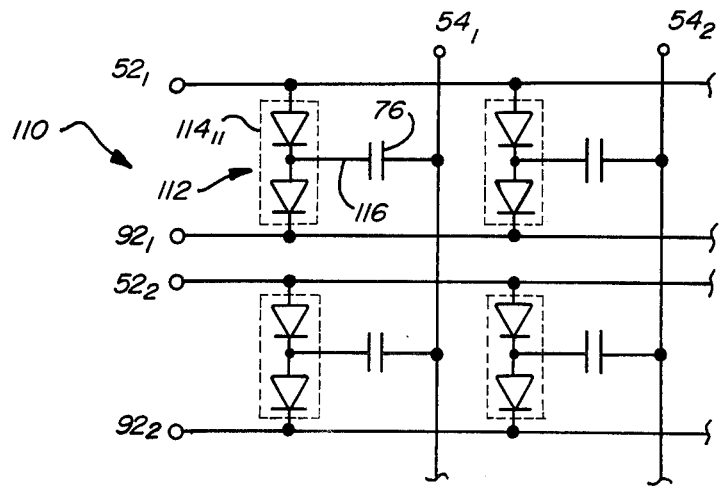
Figure 4:
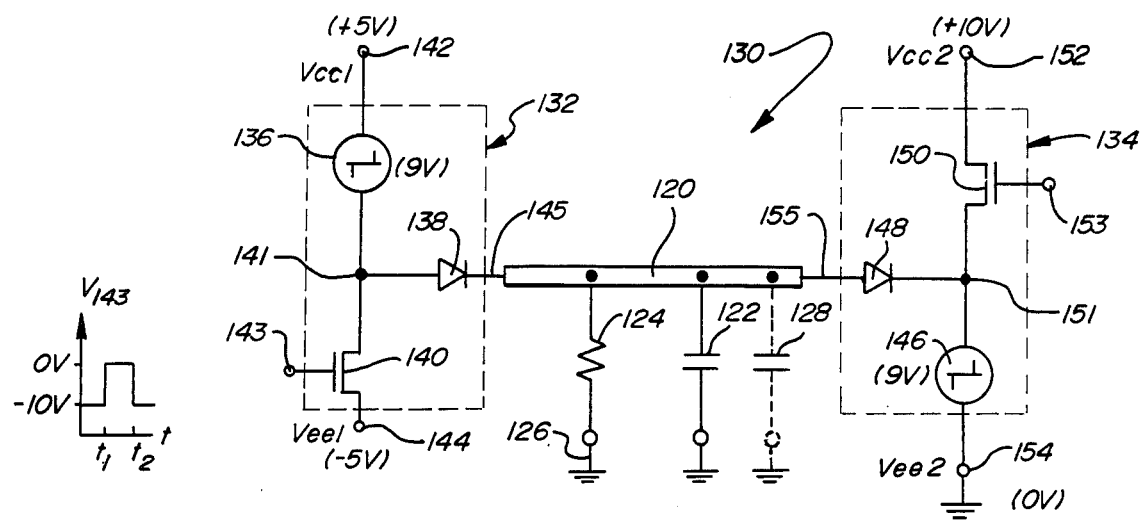
FIG. 4 is a simplified schematic diagram of one embodiment of the present invention having two line driver circuits, each employing a threshold switch and transistor.

Since the line driver circuits of the present invention are usable with virtually any type of electronic array, the type of cell to which the address line or conductor being driven thereby is connected may vary widely. For the purpose of explaining the present invention, the address line or conductor of the electronic array which is used to access multiple locations or cells within the array, and any cells or devices connected thereto, can be modeled as is shown in FIG. 4. A typical single address line or conductor of the electronic array that is to be driven by one or more line drivers of the present invention is represented by a broad line 120 which may be assumed to be an ideal zero impedance conductor to which two or more cells or devices to be accessed are connected. Address line 120 could be any one of the address lines $52_I$, $54_J$ or $92_I$ described with respect to the arrays depicted in FIGS. 1 through 3, for example. It could also be a power bus conductor, supply or ground conductor in such an array, which is to be switched among a plurality of voltage levels or conditions.

A capacitor 122 represents the combined capacitive load presented to the line driver by address line 120 and the cells or devices connected thereto. A resistor 124 represents the combined resistances of the cells or devices connected to the address line 120 and available to discharge the address line to another common average voltage level such as ground 126. This resistance value can include the effect of any leakage paths through the cells and insulative materials surrounding the cells or address line, as well as the average active current load represented by the cells or devices connected to address line 120, such as while a line driver circuit is operating to achieve or maintain a desired waveform, voltage or charge on the line. Optional capacitor 128 shown connected in dotted lines can be used to model any extra capacitance that is intentionally added to the address line 120 for the purpose of storing extra charge on the line to maintain a desired waveform or voltage level.

FIG. 4 is a circuit diagram showing two line driver circuits of the present invention connected to a single address line 120 for the purpose of selectively impressing a desired signal or D.C. waveform of positive polarity on an intermittent or repetitive basis. The two line driver circuits 132 and 134 are shown enclosed in dotted lines. The line driver circuit 132 includes a two terminal threshold switch 136, an isolation device which is preferably a rectifying device such as diode 138, and a field effect transistor 140, all connected as shown between a first positive supply $V_{CC1}$ available at terminal 142 and a first negative supply $V_{EE1}$ available at terminal 144. The cathode of diode 138 is shown connected to address line 120 by a conductor 145. The second line driver circuit 134 includes a two terminal threshold switch 146, a isolation device which is preferably a rectifying device such as a diode 148 shown as a diode, and a field effect transistor 150 connected as shown between a second positive voltage supply $V_{CC2}$ at terminal 152 and a second respectively lower voltage supply $V_{EE2}$ at terminal 154, which in general may be at a voltage above that of supply $V_{EE1}$. The anode of diode 148 is connected to address line 120 by a conductor 155. The voltage levels of the supplies $V_{CC1}$, $V_{CC2}$, $V_{EE1}$ and $V_{EE2}$ may each be chosen to be any suitable value which allows the line drivers 132 or 134 to operate as intended and thereby produce the two desired differing D.C. voltage levels on line 120, which levels may be positive and zero, negative and zero, or positive and negative. For the purposes of the following explanation, the voltage levels of these four voltage supplies may be assumed to be $+5$ V, $+10$ V, $-5$ V, and 0 V respectively, as shown.

Figure 5A:
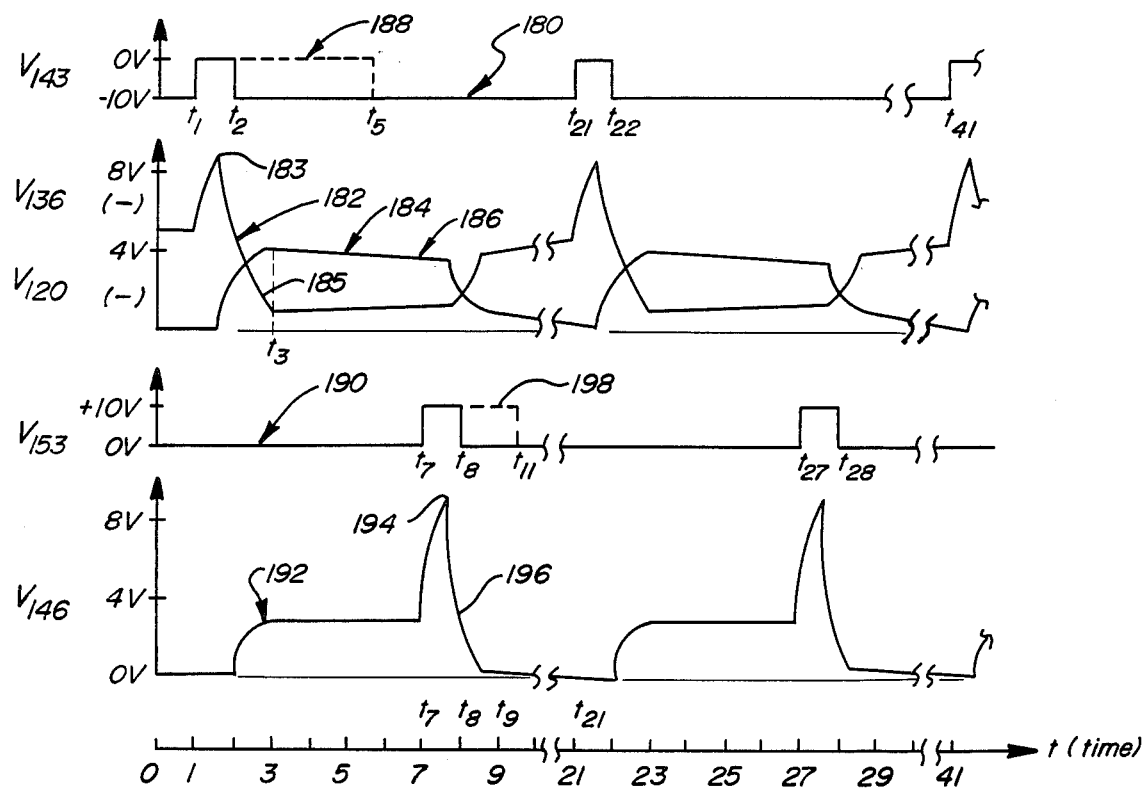
FIG. 5 is a timing diagram showing exemplary waveforms for the FIG. 4 circuit.
FIG. 5B is an I-V curve characteristic of a typical threshold switch.
Figure 5B:
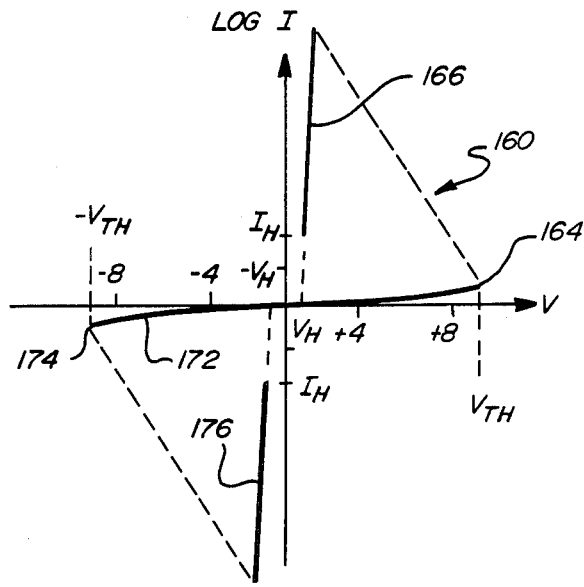

A typical I-V characteristic for a threshold switch having a threshold voltage $V_{TH}$ of about 9 volts is presented in FIG. 5B as complex symmetrical curve 160. As shown by curve portion 162 in Quadrant I of FIG. 5A, when the switch is in its "off" state, the current increases only very slightly with increasing voltage up to point 154 where the threshold voltage $V_{TH}$ is reached. Upon reaching this voltage, the resistance of the switch changes very rapidly to a highly conducting "on" condition represented by portion 166 of curve 160 and remains in that highly conductive state until the current through the device falls below the minimum holding current $I_H$. The holding voltage $V_H$ associated with $I_H$ is typically on the order of one tenth volt to one volt depending upon various parameters such as the type, thickness and cross-sectional area of the semiconductor layer in the threshold switch. The resistance just before point 154 on the high resistance portion 162 of the I-V curve may be 4 or 5 orders of magnitude or more higher than the on resistance in portion 166 of the curve. The on resistance may range typically from several ohms to several hundreds of ohms, while the off resistance may range from one or several hundred thousand ohms to several hundred megaohms (or more), depending on the aforementioned parameters. The negative portions of the curve in Quadrant III of the FIG. 5B diagram, namely the high resistance portion 172 and the low resistance portion 176, as well as the negative threshold switching voltage at the point 174, are closely symmetrical to the positive portions of the 1-V curve 160. The actual time required to switch a threshold switch fromm off to on depends upon a number of factors within the control of the integrated circuit designer, such as device thickness, threshold voltage, semiconductor material choice, slew rate of the triggering voltage pulse and the like, as explained in the above-cited journal articles. In the line drivers of the present invention, the threshold switches are preferably operated as direct current (D.C.) devices, that is either in Quadrant I or Quadrant III of their I-V curves, but not both.

The operation of circuit 130 of FIG. 4 will now be explained with reference to FIG. 5A. The five waveforms 180, 182, 184, 190 and 192 shown in FIG. 5A correspond respectively to the voltage at node 143, the voltage across threshold device 136, the voltage of address line 120, the voltage applied to gate 153 of transistor 150, and the voltage across threshold device 146, as is indicated by the symbols, $V_{136}$, $V_{120}$, etc. associated with the vertical axes of their respective waveform graphs. For convenience, the forward voltage drop across the diodes shown in the Figures such as diodes 138 and 148 will be assumed to be about one volt. Also the threshold voltages of all of the threshold devices in the Figures such as in FIG. 4 will be assumed to be 9 volts. Those in the art will appreciate, however, that the forward drop across the diodes will vary depending on well-understood factors such as type of diode, its geometry, current therethrough and the like. Also, they will appreciate that the threshold voltages of the threshold switches used in the present invention can be readily varied to any desired voltage value by providing a predetermined length or thickness of the current path through the semiconductor material in the devices. Similarly, the size of the thin film diodes and threshold switches and the like can be varied as needed to suit current requirements.

Initially, as shown in FIG. 5A at time $t_0$, the address line 120 is at zero volts, and threshold devices 136 and 146 and transistors 140 and 150 are in their nonconducting state. At time $t_1$ the input signal 180 to gate 143 of transistor 140 goes high thus turning transistor 140 on.

As transistor 140 begins to conduct, the voltage level of node 141, which was at about zero volts, drops toward the supply voltage $V_{EE1}$, which is at $-5$ V. As shown in waveform 182, this causes the voltage across threshold device 136 to rise reaching 9 volts at point 183, causing the threshold device 136 to turn on. Device 136 then immediately supplies current at a high rate to node 141, address line 120 and transistor 140, which saturates. It also causes the voltage on node 141 to approach $V_{CC1}$, which is at $+5$ volts. At time $t_2$, transistor 140 is turned off by input signal 180 going low. The voltage across the threshold device 136 diminishes to a fraction of one volt as shown at point 185 of waveform 182, as the voltage level of the address line 120 rises to approximately 4 volts at time $t_3$ as shown in waveform 184. As the rate of charging of address line 120 diminishes, the current through threshold device 136 decreases, until at time $t_3$, it passes to below the minimum holding current for device 136, at which time device 136 reverts to its high impedance state.

With the threshold device 136 off, the charge stored across capacitor 122 is used up by or leaks off through the cells and leakage paths, which are represented by resistor 124. Accordingly, the voltage on address line 120 begins to fall at a slow rate as shown by gently sloping portion 186 of waveform 184. During the period of time between $t_3$ and $t_7$, an individual cell or all of the cells connected to address line 120 may be reliably accessed or addressed by applying suitable voltages to the corresponding address lines connected to the opposite sides of these cells in a manner well understood in the art.

Once the first threshold device 136 turns on causing the voltage on line 120 to rise, the voltage across the second threshold device begins to rise as well, as shown in waveform 192, once the junction voltage of diode 148 is overcome since the charge on line 120 is free to flow through diode 148.

At time $t_7$, the waveform 190 applied to gate 153 of the second transistor 150 switches from a low state, which may be about zero volts, to a high state, which may be about $+10$ volts, thus causing transistor 150 to turn on. As transistor 150 begins to conduct, the voltage of node 151 rises quickly, approaching the supply voltage $V_{CC2}$, which is 10 volts. Once the voltage across threshold device 146 exceeds 9 volts, as shown at point 194 of waveform 192, the switch 146 quickly changes from its high resistance state to its low resistance state, thus allowing the voltage of node 151 to fall rapidly. Once below about three volts, as shown at point 196, switch 146 begins to rapidly discharge address line 120. By time $t_9$, the current flowing through device 146 has diminished to below the minimum holding current, and thus device 146 reverts to its high impedance state. The voltage on address line 120 similarly decreases between the firing of threshold switch 146 and time $t_9$ to a voltage about equal to $V_{EE2}$ plus the forward drop or junction voltage of diode 148. If $V_{EE2}$ is at zero volts, address line 120 will be at approximately one volt, assuming the junction voltage of diode 148 is about one volt. If it is desired to return address line 120 to very near zero volts, the supply voltage $V_{EE2}$ can be slightly lower, for example, approximately $-1$ volt.

As shown in FIG. 5A, the addressing cycle just described with respect to address line 120 may be repeated at some later time intervals such as $t_{21}$ and $t_{41}$. Although the timing diagram presented in FIG. 5A shows the time intervals between $t_0$, $t_1$, $t_2$ and the like as being equal, those in the art will appreciate that the time intervals need not be equal. In particular, a time interval longer than four units may readily be provided between $t_3$ and $t_7$ to allow more time to access the cells associated with address line 120 while address line 120 is a $+4$ volts.

In general, it has been found that with threshold switches, the turn on time is dependent on a nonlinear fashion upon the voltage difference by which the threshold voltage of such a switch is exceeded. Thus, faster turn on time of threshold devices 136 and 146 can be provided by increasing the magnitude of the voltage pulse provided to nodes 141 and 151, respectively. This may be achieved by increasing the absolute magnitude of the supply voltages $V_{EE1}$ and $V_{CC2}$, for example.

The diodes 138 and 148 are important components in the threshold switching circuits 132 and 134 respectively. They minimize the amount of stray charge which must be dumped through their respective field effect transistors in order to turn their respective threshold switches on. For example, in order to turn on threshold switch 136, only the charge associated with one side or electrode of threshold switch 136, diode 138 and transistor 140 connected to node 141 need be dissipated or dumped by field effect transistor 140, since the diode 138 effectively prevents any charge on address line 120 or any of the cells connected thereto from being dumped through transistor 140. Accordingly, transistor 140 can be relatively small, and operate quickly since it does not need much current-handling capability to dump the aforementioned device charge and any charge on node 141 itself. The diode 148 performs a similar function for threshold switching circuit 134.

Some types of electronic arrays, like thin film arrays used in certain flat panel displays, have relatively large current requirements during the time when an address line is being selectively accessed. By way of illustration, consider the typical cell in a flat panel display that consists of two closely spaced electrodes which act as a miniature capacitor having parallel plates separated by light influencing material such as nematic liquid crystal material which acts as a relatively high resistivity dielectric. The electrode area of each cell is fairly large, typically on the order of several hundred microns on a side. To prevent damage to the liquid crystal material, which can be caused by sustained D.C. voltages applied thereto, each cell is charged with alternating polarities, that is exposed to opposite voltages during successive frame periods. In such applications the charge supplied through a threshold switch, such as threshold switch 136 for a brief period of time at the start of an access cycle to the address line may be insufficient to completely charge the cells such as the picture elements of a display to the desired voltage. One solution to this possible problem is to keep the threshold switch 136 on longer or to turn it on repetitively during a single access cycle to the address line. This can be accomplished by simply extending the period of time during which the waveform 180 applied to gate 143 of transistor 140 is kept high. For example, the gate terminal 143 could be kept continuously high until approximately time $t_5$ as shown in the dotted lines 188 of waveform 180 in FIG. 5A. Alternatively, the triggering signal applied to the gate or input terminal may be periodically pulsed, such as with a higher frequency waveform like a sawtooth waveform, during the interval of time the threshold switch is to be kept on or repetitively turned on. In such a circuit, it may be preferable to size transistor 140 such that the amount of current continuously drawn therethrough would be slightly greater than the minimum holding current of threshold switch 136, thereby keeping switch 136 on, even if the address line 120 did not happen to require as much charge as normally expected during one particular access cycle. This same strategy could be employed with respect to the second threshold switching circuit 134 in order to provide additional time to more completely discharge the address line 120 through threshold switch 146. Dotted line 198 of waveform 190 illustrates one implementation of this strategy.

Threshold switches have very high charging capability, as illustrated by recently measured pore saturation current densities of about $2 \times 10^4$ amps per square centimeter in a few such devices. Thus, it is feasible, when using the line drivers of the present invention, to intentionally provide additional capacitance on or connected to a conductor or address line such as line 120. Such additional capacitance could readily be provided for example by forming an insulated plate connected to a voltage source such as ground directly underneath the conductor to be charged by the line driver circuit. Additional capacitance provided in this manner would provide two advantages. First, the added charge accumulated on the additional capacitor 128 would help reduce the voltage drop experienced on address line 120 through cell or leakage resistance 124 after the time during which the threshold switch 136 has changed from its conducting to non-conducting state. Secondly, the additional current required to charge capacitor 128 would help keep threshold switch 136 on slightly longer, giving the line driver circuit 132 a greater opportunity to cause the address line 120 to assume its intended voltage. This is desirable, since on occasion for certain types of arrays, the cell associated with address line 120 may not require much if any charge during a particular access cycle. This could occur, for example, if only a small percentage of the cells associated with that line are being turned on or otherwise driven that access cycle.

Figure 6:
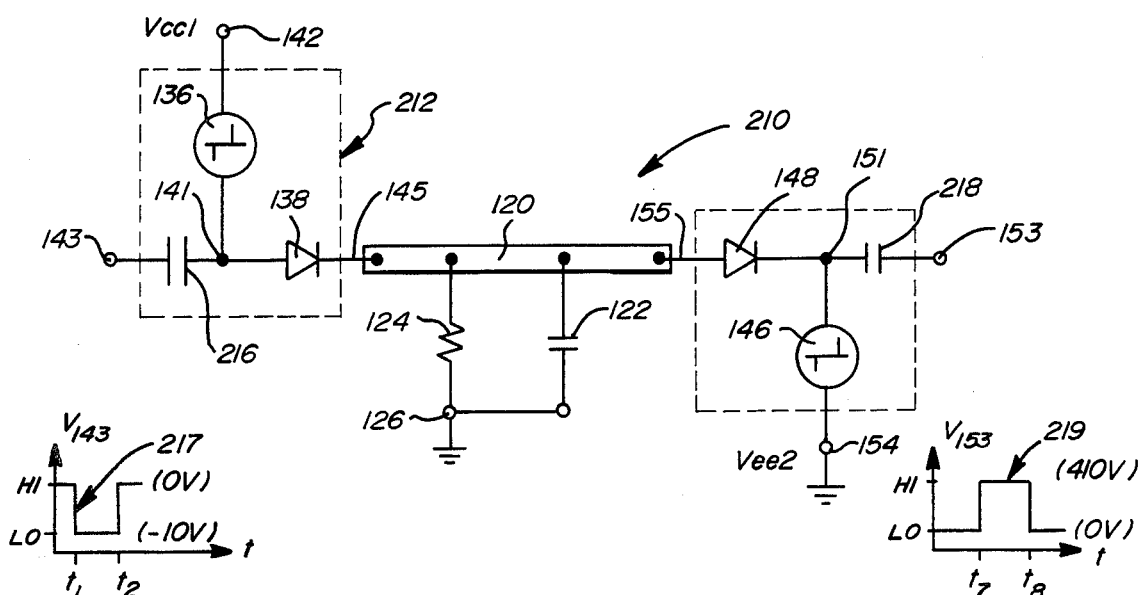
FIG. 6 is a schematic diagram of two line driver circuits of the present invention each using a threshold switch and capacitor.

FIG. 6 is a diagram of another circuit 210, having an address line 120 and two line driver circuits 212 and 214, which differs from circuit 130 of FIG. 4 in that capacitors 216 and 128 have replaced transistors 140 and 150 in the FIG. 4. By appropriately sizing capacitor 216 a signal for triggering threshold switch 136 may pass from input terminal 143 to node 141. Capacitor 218 could be similarly sized to allow a trigger signal applied to input terminal 153 to turn on threshold switch 246. As shown in FIG. 6, the waveform 217 applied to input terminal 143 in circuit 210 preferably goes from high to low at time $t_1$, and from low to high at time $t_2$. The waveform 219 applied to input terminal 153 in circuit 210 should normally be low, such as at zero volts, and go high momentarily such as to +10 volts, as shown, to trigger threshold switch 146 in circuit 210.

FIG. 7 is a diagram of another circuit 220 having an address line 120 and two line driver circuits 222 and 224, which differs from circuit 130 of FIG. 4 in that rectifying devices such as diodes 226 and 228 have replaced for transistors 140 and 150 respectively. The waveforms used to drive input terminals 143 and 153 of circuit 220 may be substantially identical in general shape and polarity to the waveforms 217 and 219 utilized to drive the input terminals of the FIG. 6 circuit.

Various nonlinear switching devices may be utilized in place of diodes 226 and 228 in circuit 220. For example, as shown in FIG. 7B, the n-i-n semiconductor devices 226' and 228' may be substituted for diodes 226 and 228 respectively. As shown in FIG. 7C, n-pi-n nonlinear threshold devices 226" and 228" may be a substituted for diodes 226 and 228 respectively. Clearly, analogous p-i-p devices or p-nu-p devices may be used instead of those shown in FIG. 7B and FIG. 7C. The construction and operation of the devices of FIGS. 7B and 7C are carefully described in the two U.S. patent applications Ser. Nos. 679,770 and 720,767 cited in the discussion above about FIG. 2E. Other nonlinear devices may also be used, provided they are capable of turning on and off quickly enough. When using diodes or other nonlinear devices such as those shown in FIGS. 7A, 7B and 7C, it is necessary to take into account the amount of voltage drop that may be expected across the nonlinear device 226 (or 226' or 226") or in calculating the voltage to be applied to input terminal 143. Similar considerations also apply when calculating the voltage input requirements for the waveforms applied to input terminals 143 and 153 of the other line driving circuits discussed above.

FIG. 8 is a schematic diagram of a circuit 230, having an address line 120 and two threshold switching circuits 232 and 234, which differs from circuit 130 shown in FIG. 4 in that threshold switches 236 and 238 are utilized in place of transistors 140 and 150 respectively. Like the capacitors of FIG. 6 and the diodes and other nonlinear threshold devices of FIG. 7, the Ovonic threshold switches of FIG. 8 elminate the necessity of providing the voltages $V_{EE1}$ and $V_{CC2}$ to the line driver circuits. The threshold switches 236 and 238 also provide ultra-fast trigger switches which can be profitably utilized to turn on the main power-handling threshold switches 136 and 146. In particular, the turn on times of threshold switches is typically faster than those of other thin film devices, thus allowing line drivers 232 and 234 to operate faster than their counterparts in FIGS. 4 through 7. Since threshold switches 236 and 238 also feature higher current densities than are achievable with the aforementioned thin film transistors and nonlinear trigger devices, their use saves considerable area when integrating the circuit structure. Threshold switches 236 and 238, like the threshold switches 136 and 146, exhibit a negative resistance characteristic, as shown in FIG. 5B, which produces an advantageous result in the FIG. 8 circuit. When device 236 switches from its high impedance state to its low impedance state, there is very little voltage drop across device 236, thus allowing substantially the full voltage available from the waveform applied to input terminal 143 to be supplied to node 141. Accordingly, the main threshold switch 136 of line driver circuit 232 will see approximately the full voltage pulse applied via input terminal 143, which allows the main threshold device to turn on more quickly. Similar results are achieved when applied for the effect of utilizing triggering switch 146 with switch 238. The input waveforms in FIG. 6 may be utilized to drive the FIG. 8 line drivers. Although the FIG. 8 embodiment of the present invention and the advantages thereof have been described with respect to a threshold switch, any other thin film semiconductor devices which have a suitable negative resistance characteristic may also be used as the trigger device 236 or 238 shown in FIG. 8.

FIG. 9 is a diagram of a circuit 240 having an address line 120 and threshold switching circuits 242 and 244 which differs from circuit 130 of FIG. 4 in that the transistor 140 and 150 have been deleted entirely so that the nodes 141 and 151 are used as the input terminals 143 and 153 respectively. Accordingly, circuits 242 and 244 do not have any isolation device which functions to buffer their respective threshold switches from noise spikes which might tend to turn them on. These circuits, however, do have the advantage of applying the full trigger signal at their respective input terminals directly to the threshold switch to be turned on. The trigger signals may take the form of the input waveforms shown in FIG. 6.

Methods for making the threshold switches 136 and 146 supply current for a period of time significantly longer than the initial charging or discharging of address line 120 have already been discussed with respect to the FIG. 4 embodiment. These methods may also be applied to the other line driver circuits of the present invention, such as those in FIGS. 6 through 9. One or both of the methods may be used to maintain a nominal voltage on a conductor for still longer periods of time, such as for example, the frame time of a display. In fact, a nominal voltage on a conductor can be maintained indefinitely if desired by simply keeping the triggering signal or waveform applied.

II. Address Decoding Circuits

FIG. 10A is a diagram of a circuit 250 having two portions 252 and 254 located respectively below and above dashed line 256. The upper portion 256 represents one possible arrangement for a source of digitally encoded address signals supplied in parallel to the lower portion 252 in schematic form an integrated diode gate address decoding circuit. Circuit 252 decodes the two binary signals A and B on lines 260 and 264, their complements on lines 262 and 266, and an address strobe signal on line 268. These signals are supplied in parallel by address generator 270 and the set 272 of line drivers of the upper portion 254. The decoded signals produced by portion 252 are useful for driving input terminals such as terminal 143 shown in FIGS. 6 through 9. Specifically, the address input lines 260 through 266 are decoded by the diode logic gates contained in circuit portion 252 to produce suitable input pulses on lines 274, 276, 280. Lines 274–280 may be row select lines used to trigger four address lines in an array. For example in certain type of electronic matrix arrays whose lines or rows are successively addressed, row select lines 274–280 could be used to address four successive lines or rows R1 through R4. The truth table of FIG. 10B shows which of the input lines 274 through 280 will be on in response to any given combination of the address input lines A and B.

The upper circuit portion 254 may also include a clock signal on line 282 which is provided to a clock input on address generator 270 and to a single shot device 284 which produces a timed output on line 286 in response the receipt of the clock pulse from line 282. The timed output on line 286 functions as an address strobe signal. In other words, the timing and duration of the negative going address strobe pulse on line 268 becomes the determining factor for when each of the negative going pulses on the row select line 274 through 280 will start and how long it will last. This can be used to control the amount of time that the line driver circuits such as circuit 132 in FIG. 4 will be continuously on, provided that the trigger device is capable of handling a current which ensures the passage of at least enough current to produce the holding voltage of threshold switch 136. By varying the duration of the pulse on line 268, the minimum time that the threshold switches such as switch 136 is turned on can be readily controlled. Alternatively, by providing a higher frequency pulsating waveform to line 268, the addressed row select line can provide a repetitive triggering signal of the type discussed above.

Figure 11:
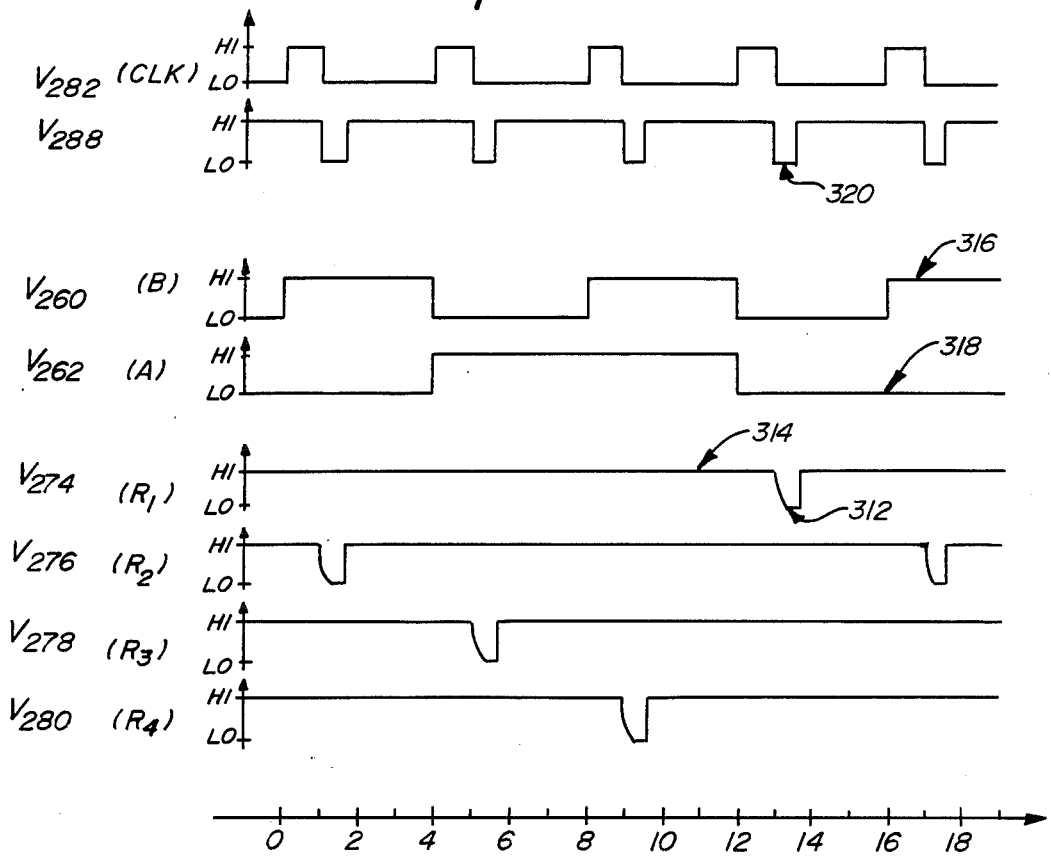
FIG. 11 is a timing diagram for FIG. 10A.

FIG. 11 shows a timing diagram indicating the voltage levels and relative positions of the waveforms at the key points in time for the circuit 250 while in operation. The signals on lines 260 through 266 and on address strobe line 268 are driven by line drivers which may be amplifiers such as operational amplifier 290 which drives address strobe line 288. Amplifier 290 is connected at its supply terminal to suitable supply voltages such as $V_{EE2}$ at terminal 292 and $V_{EE4}$ at terminal 294 which may respectively be at zero volts and $-12$ volts. When the two supplies are at these voltages, the resultant waveforms produced on those select lines 274 through 280 are suitable for driving the input terminal 143 of line driver circuits 212, 222, 232 and 242 in FIGS. 6 through 9.

The operation of the diode logic gates of circuit portion 252 of FIG. 10A may be readily understood by reference to the diode logic gate 300 enclosed within dotted lines. Logic gate 300 functions as a negative logic three input AND gate and is composed of three diodes 302, 304 and 306 and one resistor 308 connected as shown to lines 260, 264, 274, 288 and 310 which is connected to the negative supply $V_{EE4}$ at terminal 294. Only when the inputs of the AND gate, namely address input lines 260 and 264 and the address strobe line 268, are all at negative voltages such as the $-12$ volts of the supply $V_{EE4}$, is it possible to obtain a negative going output pulse on line 274. This relationship is shown in FIG. 11, wherein a negative going pulse 312 on the waveform 314 representing the output signal applied by AND gate 300 to conductor 274 occurs only when there is a coincidence of low logic levels among AND gate inputs 260, 262 and 288 as shown in waveforms 316, 318 and 320 in FIG. 11. When all the AND gate input lines go low, the diodes 302, 304 and 306 effectively become reverse biased, allowing the pull-down resistor 308 to lower line 274 to approximately to the voltage level supply $V_{EE4}$, as depicted by the negative going pulse 312 of waveform 314.

Although the integrated diode logic address decoding circuitry of FIG. 10A has been illustrated for only a two bit address, those in the art will readily appreciate that the same basic diode logic circuits and operations may be applied to digital addresses having more than two bits which must be decoded, for example, an 8 or 12 bit address. Since the number of row select lines which can be addressed is $2^M$, where M is the number of address bits, while the number of address input lines required by the diode logic circuits is given by $2 \times M$, it can be readily understood that the foregoing integrated diode logic address decoding circuit provides a dramatic reduction in the number of external connections which must be made to at least one side of an integrated electronic array for addressing purposes. Other integrated addressing circuits can also be used with the line driver circuits of the present invention, since the outputs of the address decoding gates or circuits are simply used to produce input or triggering pulses to the trigger device, such as transistor 140, capacitor 216, nonlinear device 226 or threshold switch 236 or to nodes 141 or 151 in the FIG. 9 line driver circuits of the line drivers of the present invention. Accordingly, the amount of current which the address decoding gates or circuits each must handle is relatively small, thus permitting such integrated address decoding circuitry to be fabricated from thin films in a reasonable amount of area along the perimeter of the electronic array being serviced.

FIG. 10C is a schematic diagram of a preferred embodiment of an integrated diode logic address decoding circuit 330 of the present invention. Circuit 330 is identical to circuit 252 of FIG. 10A, except that the resistors in each diode logic gate have been replaced with an active device, namely a transistor such as field effect transistor 332 whose gate is connected to a common gate line 334. The common gate line 334 may be switched between a high and low value in order to conserve power or to disable access to the address lines 120 to which the row select lines 274 through 280 of circuit 330 are connected. Another advantage of circuit 330 is that the thin film transistor devices 332 are more easily constructed than passive thin film resistors. Using transistors 332 also enables the conductance of the pull-down resistances of the diode logic gates to be adjusted.

Another preferred embodiment of an integrated diode logic address decoding circuit 335 of the present invention is partially shown in FIG. 10D. Circuit 335 is identical to circuit 330 of FIG. 10C except that the transistors such as transistor 332 haven been replaced with another type of active device, namely diodes such as diode 336. A typical diode AND gate 330″ is partially shown in FIG. 10D. The diodes in each logic gate of circuit 335 serve as a resistive element just as resistor 308 does in diode gate 300 in FIG. 10A. In operation, the diode 336 is heavily forward biased when any of the other diodes in gate 300″ such as diode 302, 304 or 306 is conducting or forward biased. This results in a very significant voltage drop across diode 336, and only a slight voltage drop across the other diode or diodes of gate 300 which are conducting. This disparity in voltage drops is due to diode 336 being more highly resistive than the other diodes. This high resistivity can be achieved in several ways depending on the type of diode used. A vertical multilayer p-i-n diode made from amorphous silicon alloys, for example, can be made more resistive by increasing the thickness of its intrinsic or "i" layer. The difference in forward-biased resistance values between diode 336 and the other diodes 302, 304 and 306 of logic gate 300″ may also be achieved by making the effective cross-sectional area of thin film diode 336 much smaller than that of the other diodes, such as three to twenty times smaller, for example. Circuit 335 of FIG. 10D has two advantages over circuit 330, namely it can be made using only one type of active element so that it requires a minimal number of processing steps, and it can readily be made using only easily formed vertical devices, as will be subsequently described.

The diode addressing arrays 252, 330 and 335 are arranged in negative logic fashion; in other words their individual logic gates provide a negative-going pulse to a selected row select line upon the receipt of a particular negative true bit pattern on the address input lines 260–266 and strobe line 268. Positive logic diode AND gates may be readily created for providing positive-going pulses to row select lines by a few modifications to the arrays 252, 330 and 335. These modifications include reversing the polarities of all diodes in each logic gate and reversing the polarity of the voltage supply connected to conductor 294. In such a positive logic diode array, the resistances (such as resistor 308, transistor 332 and diode 336) function as a pull-up resistor.

One preferred arrangement for the integrated electronic arrays of the present invention includes two thin film diode addressing arrays for each set of address lines 52 or 54. The first diode array is implemented in negative logic and provides negative-going pulses to input terminals 143 to trigger the threshold devices 136. The second diode array is implemented in positive logic and provides positive-going pulses to input terminals 153 to trigger threshold devices 146.

III. Line Driver Circuits For Producing A.C. Waveforms

Figure 12A:
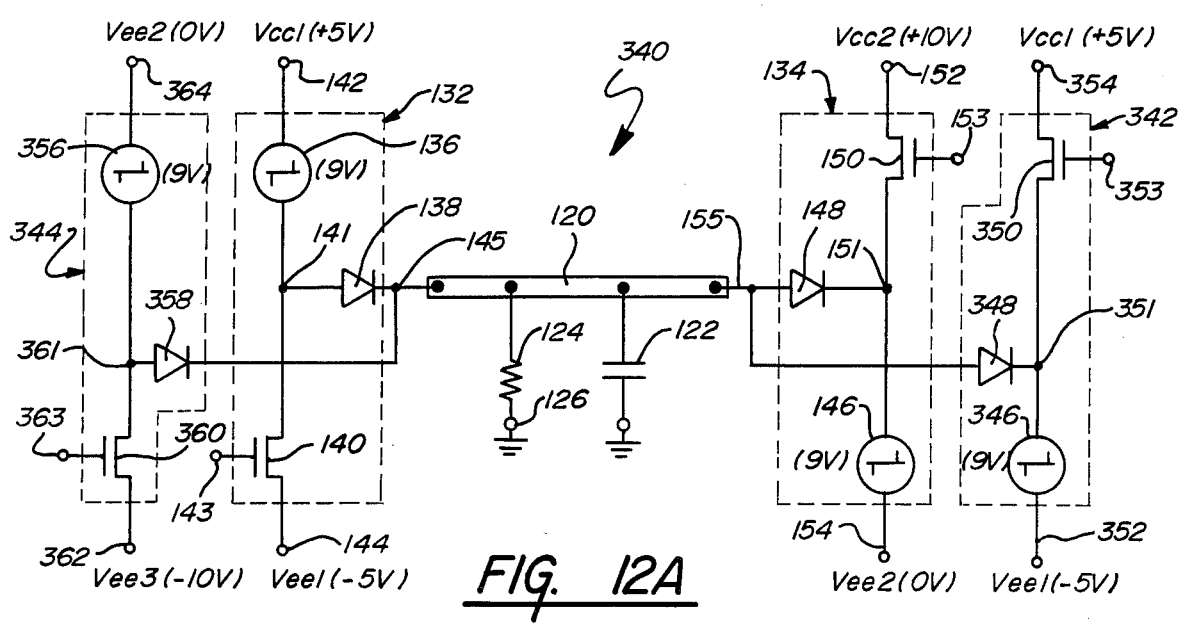
FIG. 12A is an embodiment of the present invention having four line driver circuits and useful for supplying alternating polarity signals to a conductor in an array.

FIG. 12A is a diagram of a circuit 340 having four line driver circuits of the present invention and an address line 120 which is charged to a plurality of voltages, one above and another below a reference voltage which may be zero volts. The first two line driver circuits 132 and 134 are identical to the line driver circuits of FIG. 4. The second pair of line driver circuits 342 and 344 are also identical to the circuit 132 and 134 of FIG. 4, except for the fact that the polarities of the circuits have been reversed so that the line driver circuit 342 can charge the address line 120 to a negative potential, while the line driving circuit 344 can return the address line 120 to a nominal voltage value near zero volts. The third line driving circuit 342 includes a swithing device 346, a diode 348 and a transistor 350 connected as shown in FIG. 11 between a supply terminal 352 leading to the negative supply $V_{EE1}$, and a positive supply terminal 354 leading to the positive supply $V_{CC1}$. The anode of rectifying device 348 is connected by conductor 155 to address line 120. The input terminal 353 is connected to the gate of field effect transistor 350. The line driving circuit 344 includes a threshold switch 356, a rectifying device 358 and a transistor 360 connected as shown between a negative supply terminal 362 leading to supply $V_{EE3}$, which may be a −10 volts, and a positive supply terminal 364 leading to a voltage supply $V_{EE2}$, preferably at about zero volts. The cathode of diode 358 is connected via conductor 145 to the address line 120. The input terminal 363 is connected to the gate of field effect transistor 360.

FIG. 12B is a timing diagram which illustrates the operation of circuit 340 of FIG. 12A. Waveform 365 of FIG. 12B is an illustration of the plurality of voltages circuit 340 produces on address line 120. In operation, line drivers 132 and 134 in FIG. 12A generally operate as previously described with respect to FIG. 4, in response to waveforms 180' and 190' applied to input terminals 143 and 153. Line drivers 342 and 344 are similarly operated in that a positive going pulse 366 of waveform 367 applied at input terminal 353 turns on transistor 350, while a suitable positive going pulse at input terminal 363 turns on transistor 360. When transistor 350 is on, the voltage of node 351 is temporarily raised so as to momentarily place a voltage across threshold switch 346 greater than its threshold voltage. This turns on device 346, which charges address line 120 to a negative voltage such as −4 volts by current flowing through diode 348 and switch 346 to supply terminal 352. To turn on threshold switch 356, transistor 360 is turned on, so that the voltage across node 361 is temporarily lowered so as to momentarily place a voltage across threshold switch 356 greater than its threshold voltage. This turns on device 356, which discharges address line 120 to a voltage near zero volts by current flowing from supply terminal 364, through device 356 and diode 358 into the address line 120. The circuit 340 is thus well suited for periodically applying alternating polarity voltage levels to an address line 120, as is required in many electronic arrays, especially those of the liquid crystal display type.

The circuit 340 of FIG. 12A can also be used to produce on address line 120 the alternating polarity waveform 370 shown in the timing diagram of FIG. 12C. To produce waveform 370, it is only necessary to utilize the line driving circuits 132 and 342; hence, the line driver 134 and 344 may be omitted from circuit 340 if desired. A positive going voltage pulse on waveform 180' at time $t_1$ applied to input terminal 143 turns on threshold switch 136 thus allowing the voltage on line 120 to rise to approximately 4 volts. At time $t_4$ the waveform 180' applied to terminal 143 goes low. At time $t_{11}$, a positive going pulse 366 on waveform 367 applied to input terminal 353 turns threshold switch 346 on, causing the voltage on address line to become approximately $-4$ volts. At time $t_{14}$ the waveform 367 applied to terminal 353 goes lwo. As shown in FIG. 12C, this sequence may be repeated such as at time $t_{21}$.

The embodiments of the present invention which produce an alternating waveform on address lines have been shown in FIG. 12 to utilize transistors like the FIG. 4 line driver circuits. However, the alternative line driver circuits illustrate in FIGS. 6 through 9 may also be modified to produce A.C. waveforms in a manner similar to the manner in which FIG. 4 was modified to obtain the FIG. 12 circuit. Also, the line driver circuits of FIGS. 4 and 6 through 9 may be used without modification to produce A.C. waveforms on line 120, simply by adjusting the voltage levels of voltage supplies $V_{CC2}$ (if used) and $V_{EE2}$ and the triggering pulses correspondingly downward, as required.

IV. Illustrative Thin Film Structures

FIGS. 13 through 32 illustrate the construction of various preferred integrated electronic line driver circuits, address decoding circuits and arrays of the present invention. For obvious reasons, the thin film structures of these Figures are not shown to scale. In this regard, the layout of and interconnections among devices shown in the Figures is only meant to be illustrative in a general sense of how such thin film structures may be arranged relative to one another. To avoid unduly complicating the Figures, only two typical lines or rows of such circuits or arrays are shown. For the same reason, the insulation layer or layers are not shown in these Figures containing a plan view. For convenient reference, the lines of the array are at times referred to as rows and are arbitrarily designated as line $52_1$ (or $120_1$) and line $52_2$ (or $120_2$). Similarly, the reference numerals used to identify the line driver circuits, the various devices, layers and conductors used with line or row 52, or $52_1$ includes the subscript "1" or "2" respectively to more positively identify which line the device, layer or conductor in question is associated with. Such subscripts are at times not used in the Figures or the accompanying description where it is not necessary to specify a specific line or row, or where the reference numeral in question may be applied generically to devices, layers, conductors, etc. in more than one row.

Figure 14:
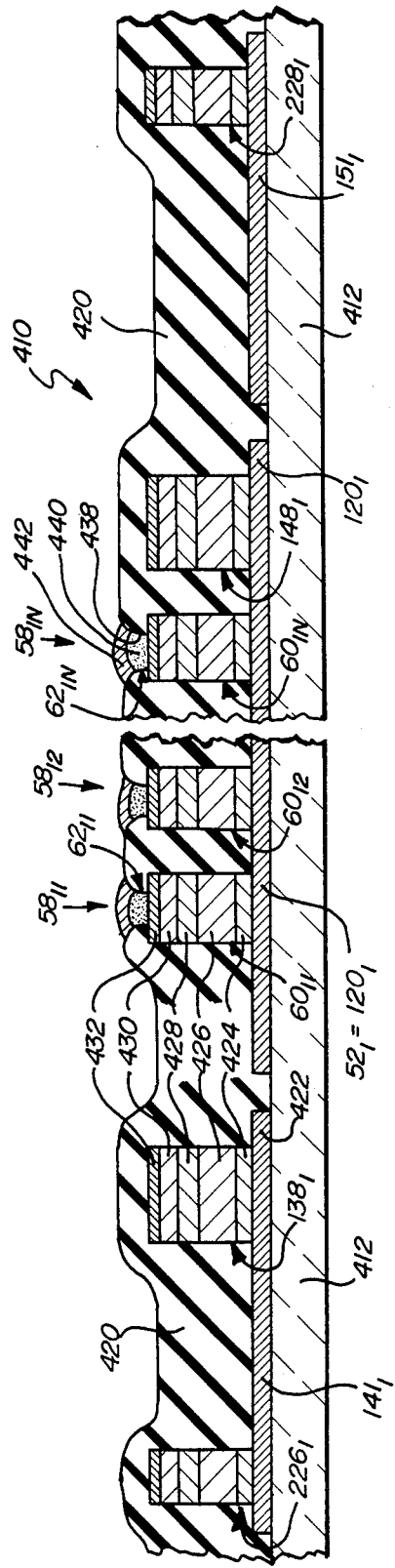
Figure 15:
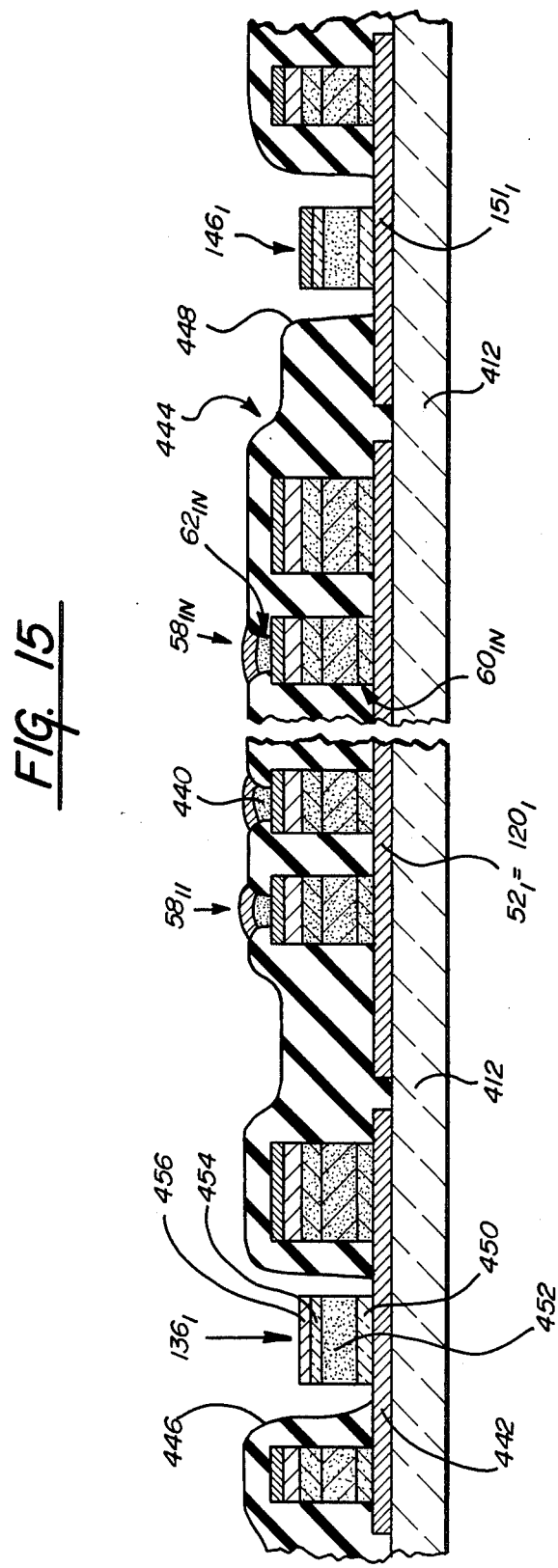
Figure 16:
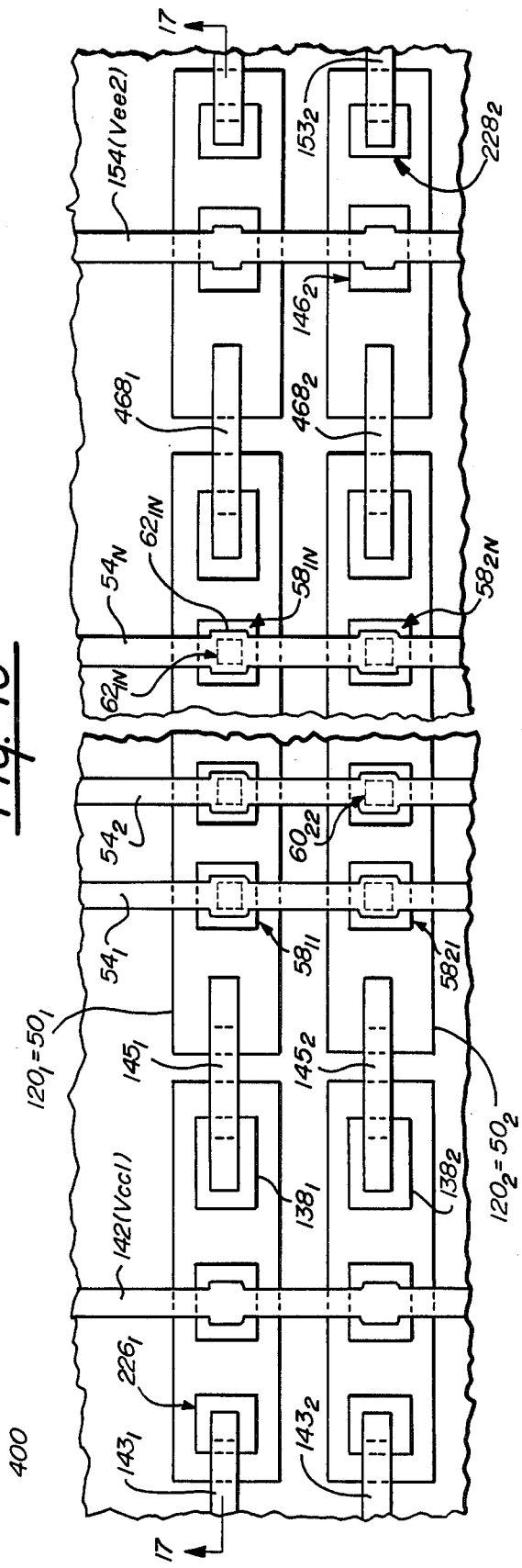
Figure 17:
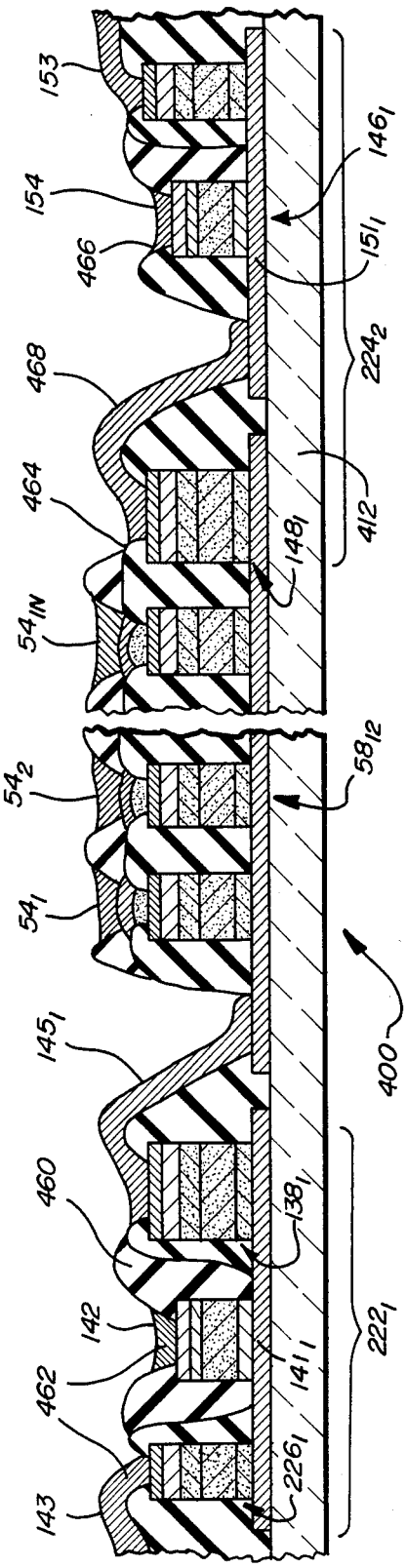

FIGS. 13 through 17 illustrate the construction of a preferred integrated electronic memory array of the present invention, which includes two line driver circuits 222 and 224 of the type shown in FIG. 7A which uses diodes as trigger devices. The completed electronic memory array with integrated line drivers is shown in FIGS. 16 and 17. An explanation of specific material and processing steps used to fabricate the electronic array 400 will now be given.

Figure 13:
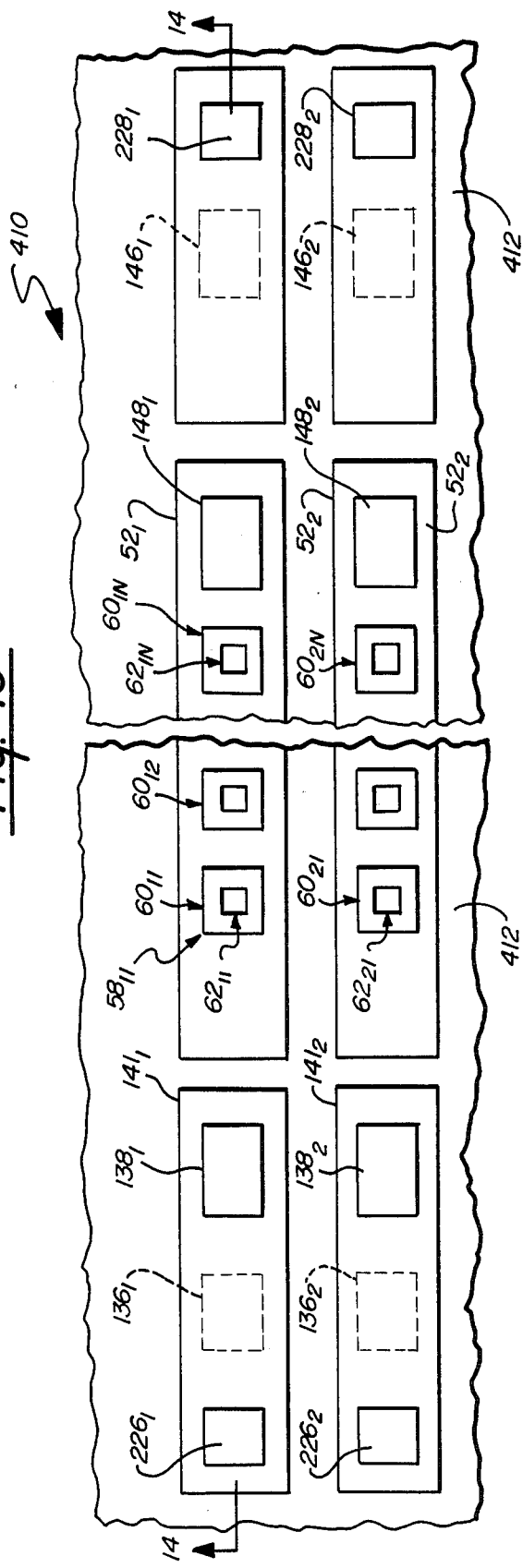

Referring to FIGS. 13 and 14 there is shown a partially completed electronic array 410 which is constructed on an insulating substrate 412, which may be glass or a insulated conductive material such as a metal substrate coated with a top insulating layer. Directly above the substrate 412 is a bottom metal layer which has been patterned to form conductive line 120 and conductive pads 141 and 151. Diodes $138_1$ and $226_1$ are constructed upon a patterned metal pad $141_1$. Diodes $60_{11}$, $60_{12}$ through $60_{1N}$, and $148_1$ are constructed on top of patterned metal line $120_1$. Diode $228_1$ is constructed on top of patterned metal pad $151_1$. Constructed on top of diodes 60 are the corresponding memory elements $62_{11}$, $62_{12}$ through $62_{1N}$. As earlier explained with respect to FIGS. 1 and 2, an isolation device $60_{IJ}$ and its corresponding memory element or device $62_{IJ}$ may constitute a programmable cell $58_{IJ}$. The diodes 138, 148, 226 and 228, as well as the programmable cells 58, are preferably mesa structures which are horizontally spaced apart from one another. A layer 420 of insulation is subsequently deposited between the individual mesa structures as shown in FIG. 14.

The partial integrated electronic array 410 shown in FIGS. 13 and 14 is preferably constructed using the following sequence of processing steps. Six layers of thin film material 422, 424, 426, 428, 430 and 432 are sequentially deposited in order, one after the other. Layer 422 is a conductive bottom layers, layers 424 through 428 are non-single-crystal semiconductor layers which form a large area diode structure, and layers 430 and 432 are top conductive layers. Layer 422 is preferably a metal layer which makes ohmic contact with the bottom-most semiconductor layer 424. Semiconductor layers 424, 426 and 428, are preferably continuously deposited to form a large area p-i-n amorphous silicon alloy diode which will be subsequently patterned into many little p-i-n diodes. The silicon alloy layers 424–428 each should include at least one density of states reducing element, such as hydrogen or fluorine, incorporated therein. Preferably, both hydrogen and fluorine are utilized. Preferably, the deposition of the semiconductor layers 424, 426 and 428 is performed in an uninterrupted sequence while the substrate remains under a partial vacuum so that none of the surfaces of the layers are exposed to air or other possible sources of contaminants. In this manner, clean interfaces between adjacent layers is ensured, which helps improve the integrity and electronic properties of the interfaces. The p-type layer 424 and/or the n-type layer 428 can also be made of microcrystalline material, if desired. The term "amorphous", as used herein includes all materials or alloys which have long range disorder, although they may have short or intermediate range order or even contain, at times, crystalline inclusions. Also, as used herein, the term "microcrystalline" is defined as a unique class of set amorphous materials characterized by a volume fraction of crystalline inclusions, said volume fractions of inclusions being greater than a threshold value at which the onset of substantial changes in certain key parameters such as electrical conductivity, band gap and absorption constant occur.

The conductive layer 430 immediately adjacent the p layer 428 can be any suitable metal which makes ohmic contact with the layer 428. The uppermost layer 432 is not particularly necessary to form the p-i-n diode mesa structures 60, 138, 148 and 228. Instead, it is provided as a conductive barrier layer for the subsequent deposition of the layer of memory semiconductor material which is subsequently deposited thereon. Preferred materials and typical thicknesses for layers 422 through 432 are given in Table 1 below, which lists in reverse order of deposition of the various layers of a typical memory cell $58_{IJ}$ in the arrays 440 and 410.

TABLE 1

| Reference Numeral | Preferred Material | Typ. Thickness (In Angstroms |
|---|---|---|
| 462 | aluminum | 7000 |
| 442 | molybdenum | 1000 |
| 440c | Te | 3000 |
| 440b | $Ge_{15}Te_{31}Sb_2S_2$ | 2000 |
| 440a | $Ge_{24}Te_{72}Sb_2S_2$ | 2000 |
| 420 | $SiO_xN_y$ | 5500 |
| 432 | molybdenum | 1500 |
| 430 | chromium | 20 to 60 |
| 428 | $n^+$-type a-Si:H:F | 300 to 400 |
| 426 | i-type a-Si:H:F | 3000 |
| 424 | p-type a-Si:H | 300 to 400 |
| 422 | molybdenum | 5000 |

Once the layers 422 through 432 have been deposited, a layer of photoresist is deposited thereover, and exposed and developed so as to leave patterned photoresist only above the locations where the diode mesa structures 60, 138, 148, 226 and 228 are to be formed. Using dry etchants, the top metal layers 432 and 430 and the semiconductor layers 428, 426 and 424 are etched away as shown in FIG. 14.

Thereafter, in order to pattern the bottom metal layer 422, a second layer of photoresist is deposited, exposed and developed. The remaining patterned portions of the second photoresist layer serves as a mask so that the bottom metal layer 422 may be photolithographically patterned into lines 52 and pads 141 and 146 as shown in FIGS. 13 and 14. The second layer of photoresist is then removed.

Various materials and detailed processing steps for making multilayer p-i-n diode structures of amorphous silicon or germanium alloys through plasma-enhanced chemical vapor deposition, i.e., glow discharge, are fully described in U.S. Pat. Nos. 4,226,898 and 4,485,389 to S. R. Ovshinsky et al. Methods for forming diode mesa structures like those shown in FIG. 14 multilayer p-i-n diodes are fully described in co-pending U.S. patent application Ser. No. 851,756 filed Apr. 14, 1986 in the names of M. Vijan, et al and entitled "Method Of Forming Thin Film Semiconductor Devices". These two patents and patent application are hereby incorporated by reference. If desired, the bottom metal layer 422 may be patterned prior to the deposition of layers 424 through 432.

After layers 422 through 432 have been patterned a layer 420 of insulating material is deposited over the complete diode mesa structures, as shown best in FIG. 14. Layer 420 may be formed from any suitable insulator such as silicon oxide ($Si_xO_y$) or silicon nitride ($Si_xN_y$). The preferred material for layer 420 is siliconoxynitride, as noted above in Table 1. Insulating layer 420 is then photolithographically patterned so as to form various openings or vias therein, such as the pores above the diode mesa structures 60, such as exemplary pore 438 above diode $60_{1N}$. After the resist used for this patterning is removed, a thin film of semiconductor memory material 440 is deposited over the entire electronic array structure, followed by the similar deposition of a top metal layer 442 if the pores are deep enough. The semiconductor memory material 440 enters the pores such as 438 above the diode 60 and is effectively sealed therein by the metal layer 442. Thereafter, the metal layer 442 and the semiconductor memory material layer 440 are patterned, leaving isolated memory elements 62 above the diode 60 as shown in FIGS. 13 and 14. Each memory device 62 may have a profile like a mushroom with cap if layer 440 extends slightly outward from the top periphery of its pore, due to the film of memory material 440 being thicker than the pores are deep.

The preferred materials and thicknesses for layers 438, 440 and 442 are disclosed in Table 1.

As disclosed in Table 1, the memory material or film 440 is preferably composed of three separate layers 440a, 440b and 440c of different materials, which are preferably sequentially deposited in uninterrupted sequence while under a continuously maintained partial vacuum. The memory film thus made may be patterned to produce a semiconductor memory structure which may be repetitively programmed. A number of different types of thin film semiconductor memory materials, some of which may be programmed once and other of which may be programmed many times, are known in the art. See, for example, the following U.S. patents which fully describe several such memory materials, including how to make and use them in electronic memory arrays and how to program them.

| | |
|---|---|
| 3,573,757 | 3,846,767 |
| 3,629,863 | 3,875,566 |
| 3,675,090 | 3,877,049 |
| 3,699,543 | 3,886,577 |
| 3,816,197 | 4,499,557 |

The foregoing ten patents are hereby incorporated herein by reference. Any such suitable memory material or materials may be used in the cells 62 of electronic memory arrays of the present invention.

After completing the structure 410 shown in FIGS. 13 and 14, further processing steps are performed on it to make the partial integrated electronic array structure 444 shown in FIG. 15, which includes two vertically arranged threshold switches 136 and 146 per address line 52 formed as thin film multilayer mesa structures. First, insulating layer 420 and structure 410 is photolithographically patterned and vias 446 and 448 etched therein to expose a portion of metal pad 141, and of metal pad $150_1$ so that threshold switching devices $136_1$ and $146_1$ can be formed thereon. With the photoresist layer used to pattern insulation layer 420 still present, the layers 450, 452, 454 and 456 are deposited. Layers 450 through 454 are continuously deposited in an uninterrupted sequence while the substrate remains under a partial vacuum, thereby ensuring formation of clean interfaces between adjacent layers to minimize defects and improve the electronic properties of the resultant threshold switches. Specifically this multilayer construction and this processing procedure helps ensure that D.C. stable threshold switches are formed. The layers 450 and 454 are barrier layers which help prevent sudden or gradual structural change to the semiconductor material of the threshold switch during operation, and are believed very important to achieving stability when threshold switches are operated in a direct current (D.C.) mode, as are all of the threshold switches used in the present invention. In this context, "operated in a D.C. mode" refers to flow of current through a threshold switch in only one direction. Layer 452 is a semiconductor material which exhibits threshold switching action of the type generally described above in the background portion of the specification and illustrated in FIG. 5B. The preferred composition of layers 450 through 456 are presented in Table 2 herein.

TABLE 2

| Reference Numeral | Preferred Material | Typ. Thickness (In Angstroms) |
|---|---|---|
| 462 | aluminum | 10,000 |
| 460 | $SiO_xN_y$ | 8,000 |
| 456 | molybdenum | 5,000 |
| 454 | a-carbon | 1,000 |
| 452 | $Te_{39}As_{36}Si_{17}Ge_7P_1$ | 5,500 |
| 450 | a-carbon | 1,000 |
| 422 | molybdenum | 5,000 |

On the average, the threshold voltage of such semiconductor materials is approximately 15 volts per micron of conduction path length. Therefore, in order to achieve a switching voltage on the order of 8 to 9 volts in the vertical threshold device shown in FIG. 15, for example, layer 452 is made of approximately 5200 angstroms to 6000 angstroms thick. The thickness of various thin films used in the structures of the present invention may be readily controlled using anyone of several techniques well known in the art.

After layers 450 through 456 have been deposited, a layer of photoresist is formed over layer 456 and the threshold switch mesa structures 136 and 146 shown in FIG. 15 are formed. Preferred processing steps utilized to form these layers and mesa structures are described in co-pending U.S. patent application Ser. No. 899,446 filed contemporaneously with the present application in the name of R. Pryor et al. and entitled "Thin Film Threshold Switching Device And Method Of Making Same", which is hereby incorporated by reference herein. The patterning of the mesa structures which form the threshold switches 136 and 146 as shown in FIG. 15 completes the processing of partial electronic array structure 444.

FIGS. 16 and 17 illustrate the completed integrated electronic array 400, which is constructed by depositing a layer of insulation 460 and layer of top metal 462 over the partial integrated structure 444 of FIG. 15. Specifically, insulating layer 460 is deposited over the entire structure 444, and thereafter photolithographically patterned so as to form a number of vias or openings therein, with one such opening being above each diode mesa structure and threshold switch mesa structure present on the substrate 412. Via 464 formed over diode $148_1$ and via 466 formed over threshold switching device $146_1$ are typical. After removing the patterned photoresist, the top metal layer 462 is deposited and photolithographically patterned to form a number of conductors which interconnect various locations within the electronic matrix array. For example conductor $143_1$ is connected to the top of diode $226_1$. Traces $145_1$ and $145_2$ interconnect the diodes $138_1$ and $138_2$ with their respective address line $120_1$ and $120_2$, are also equivalently called address line $52_1$ and $52_2$. In a similar fashion trace $468_1$ interconnects the top of diode $148_1$ with the conductor $151_1$. The conductors 142 and 154 which serve as buses for supplies $V_{CC1}$ and $V_{EE2}$ are also formed by patterning the top metal layer 462 into conductors as shown in FIGS. 16 and 17. The crossing address lines $54_1$ through $54_N$ may also be formed by patterning the top metal layer 462 as shown. The integrated electronic structure 400 is preferably covered with a passivating layer which may be any suitable insulating material such as silicon nitride or siliconoxynitride (not shown).

A prototype of the electronic memory matrix array wherein each cell $58_{11}$ includes an a-Si:H:F p-i-n diode mesa structure $60_{IJ}$ beneath a re-programmable memory element mesa structure $62_{IJ}$ each being of the type shown and described in FIGS. 13 and 14 and Table 1, has been constructed. The prototype array has 128 rows and 128 columns spaced on 100 micron centers. The nominal size of each of the a-Si:H:F p-i-n diodes $60_{IJ}$ is 70 microns by 90 microns. A preferred size of the openings or circular pores in insulating layer 420 in which the memory elements $62_{IJ}$ are substantially formed is about 2.5 microns. The pores may alternatively be made with diameters ranging from about one micron to about ten microns, if desired. Smaller pore sizes from about one to about five microns in diameter are preferred, in order to increase the on (or set) state to off (or reset) state conductivity ratio of each memory cell $62_{IJ}$. In particular, if the off resistance of the cells are too low, leakage paths through the various cells within the array make it extremely difficult to reliably sense or read the state of any given cell. The severity of this problem increases monotonically as the number of cells in the array increases. It has been found that the construction of each memory cell $62_{IJ}$ in its own pore surrounded by insulating material and on top of its own isolation device, which is formed as a distinct fully insulated mesa structure completely separated from other isolation devices and memory devices, significantly reduces the amount of leakage which would otherwise occur. Accordingly, the electronic memory structure disclosed herein is a particularly well suited design to use for VLSI and ULSI memory arrays having anywhere from 65,000 to several million (or more) memory cells. The large area of each vertical diode $60_{IJ}$ has been found necessary to provide sufficient current through the amorphous silicon alloy diodes to be able to successfully set and reset the semiconductor memory material or film 440 of the type disclosed in Table 1.

The memory film 440 disclosed in Table 1 is preferably formed as a highly resistive disordered amorphous semiconductor in its off or substantially nonconducting state. One or more of the foregoing U.S. patents pertaining to thin film semiconductor memory materials and devices fully describes how to program re-settable memory materials like layer 440 described in Table 1. Briefly, to program a typical memory element, a suitable pulse of preselected voltage and duration is applied to the memory element $62_{IJ}$ through diode $60_{IJ}$ to create at least one fairly low resistance path through its memory material by inducing a phase change in a portion of the material. This low resistance path typically takes the form of a more ordered "crystalline-like" filament believed to be about one micron or so in diameter, which in its conducting condition or on state, the layer 440 of memory element $62_{IJ}$ typically can handle very high current densities in comparison to its amorphous silicon alloy diode. To return the memory element to its off condition, multiple pulses of fairly high power and of preselected current and duration are applied at controlled intervals, to the memory element 62$_{IJ}$ through diode 60$_{IJ}$, thus substantially reversing the aforementioned phase change.

The current densities readily produced in the vertical threshold switches 136 and 146 shown in FIGS. 15, 16 and 17 should be about two to about 3.5 orders of magnitude higher than those readily produced in the vertical a-Si:H p-i-n diodes shown in the same Figures. Accordingly, the threshold devices 136 and 146 may be and preferably are about two to about 3.5 order of magnitude smaller than their associated a-Si:H isolation diodes 138 and 148, which handles the same currents. Thus, the use of thin film threshold switches of line driver power elements as the power-handling device in line driver circuits makes it possible to achieve very high power device and line driver circuit densities in thin film and hybrid thin film-crystalline electronic arrays.

FIGS. 18, 19A and 19B are partial views of an electronic array structure 480, having multiple line drivers using transistors such as FET 140$_1$ shown in the line drivers circuit 132 of FIG. 4. The structure 480 may be formed in a manner identical to that described with respect to the electronic array structure 400 in FIGS. 16 and 17 as far as the diode mesa structures and the threshold switch mesa structures, with the following exceptions. The first exception is that the patterned bottom metal pad 141 underneath the field effect transistor 140 must be separated into two discrete sections or pads 482 and 484 insulated from one another as shown in FIGS. 18 and 19A. Pad 484 functions as the conductor or node 141, while pad 482 has no electrical function in structure 480. Next, the diode mesa structure 226$_1$ of FIG. 14, instead of being patterned as a diode, is altered as shown in FIGS. 18 and 19 to create a field effect transistor structure. This is done by photolithographically patterning the upper portion of the p-i-n diode structure so as to sever layers 428 and 430 of the mesa structure into two spaced sections, one section including portions 428a and 428b and the other section including portions 430a, 430b, as shown. When this is done, portions 428a and 430b form one of the source or drain electrodes of the FET 140, while the other portions 428b and 430b form the other of the source or drain electrodes of the FET 140. Insulation layer 420 is then deposited into the groove 486 between the source and drain electrode portions, and patterned so as to form the insulation for the gate of the FET 140. The top layer of metal 462 is then deposited over the electronic array structure 480 and patterned so as to form the conductors 488, 490 and 492 which respectively lead to conductors 141, 143 and 144. Those in the art will appreciate that other conventional or suitable transistor structures may be used in place of the transistors 140 in thin film integrated electronic array 480.

Figure 21:
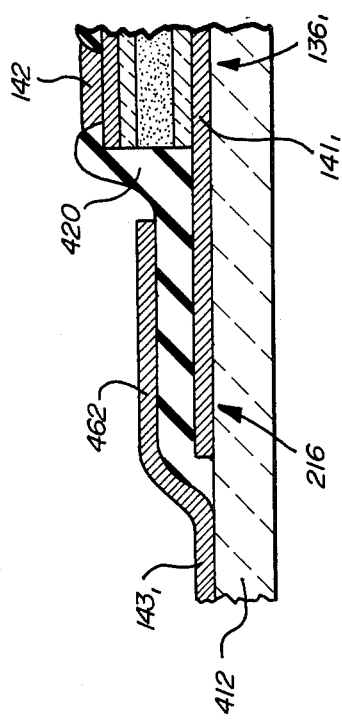
FIGS. 20 and 21 are partial plan and cross-sectional side views respectively of a structure including the line driver circuit shown in FIG. 6, with FIG. 21 taken along line 21—21 of FIG. 20.
Figure 20:
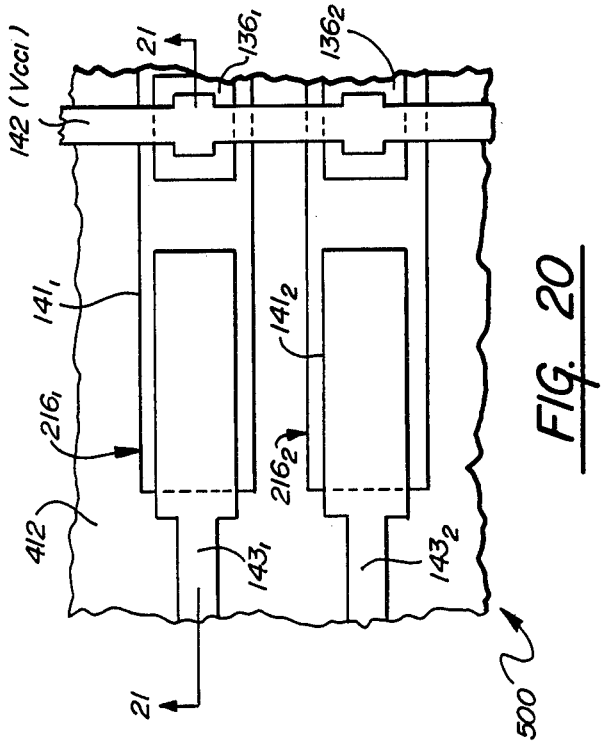

FIGS. 20 and 21 are partial views of a thin film electronic array structure 500 of including line drivers of the type shown in the line circuit 312 of FIG. 6, which uses capacitors. The structure 500 may be constructed along the lines of structure 400 shown in FIGS. 16 and 17, except that the diode mesa structures 226 and 228 are omitted and replaced with a suitable capacitor structure 216 such as the parallel plate capacitor arrangement formed by bottom patterned metal layer 141 and top metal layer 462 patterned thereabove as shown to form conductors 143. The parallel conductors 143 and 141 for each line in the electronic structure are separated by a layer of insulation 420. The thickness of layer 420 in the area of the capacitor 216 may be adjusted or partially etched away if desired to obtain the desired amount of capacitance between the parallel plates. Also the size of the overlapping areas of the parallel plates may be selected so as to obtain the desired capacitance value.

Figure 23:
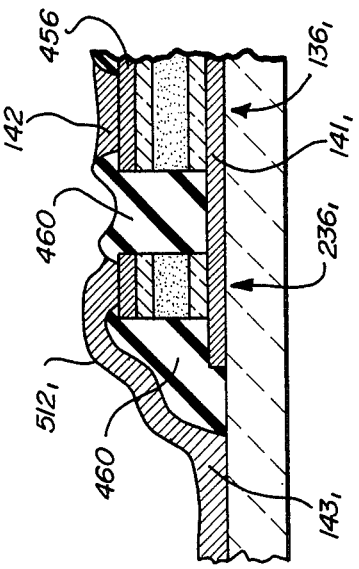
FIGS. 22 and 23 are partial plan and cross-sectional side views of a structure including the line driver circuit shown in FIG. 8, with FIG. 23 taken along line 23—23 of FIG. 22.
Figure 22:
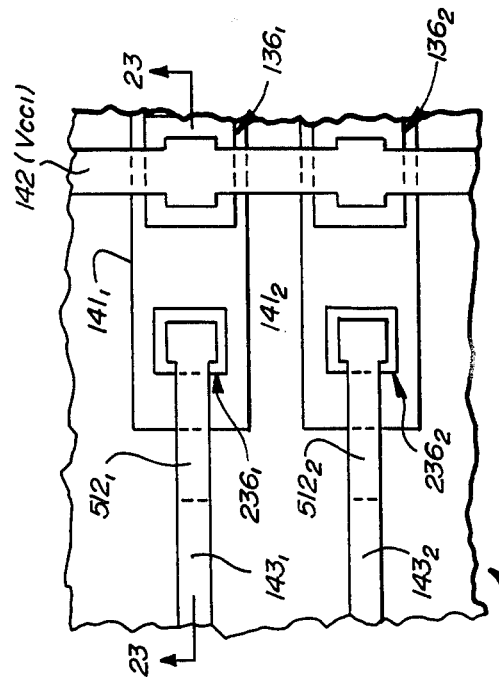

FIGS. 22 and 23 are partial views of a thin film integrated electronic structure 510 which represents one possible embodiment of the line driver circuit 232 shown in FIG. 8, which uses a threshold switch as a trigger device. The remainder of the electronic structure 510 not shown in FIGS. 22 and 23 may be formed in a manner similar to that of the corresponding portions of electronic array 400 in FIGS. 16 and 17. The threshold switches 136 of structure 510 are constructed in the same manner as those in structure 400 of FIGS. 16 and 17. The trigger threshold switches 236 may be formed at the same time and from the same layers of material as threshold switches 136. In particular, the etching steps used to form the mesa structure 136 from layers 450 through 456 may be simultaneously used to also pattern the mesa structures of threshold switches 236. Once the mesa structures 136 and 236 are complete, insulating layer 460 is deposited as shown and thereafter top metal layer 462 is deposited and patterned to form the traces 512 leading to input terminals 143.

In the circuit diagrams of FIGS. 4 through 9 and 12A, one or more line driver circuits are schematically shown at either end of address line 120. If desired these same circuits may be implemented using thin film structures constructed at just one end or side of the address line. This is advantageous, especially for very large area electronic arrays, since the amount of material required to form the threshold devices along just one edge of such arrays is far less than that required to deposit such material over the entire array to form threshold devices on opposite sides of the array. Also, less expensive deposition equipment can be used when depositing material in a linear region along one edge of such an array. FIGS. 24 through 27 illustrate one such embodiment of a thin film electronic array structure having line driver circuits of the type shown in FIG. 8 arranged along one edge or side of the matrix array structure. For ease of understanding, FIG. 24 presents the circuit 230 of FIG. 8 in a rearranged form which resembles the arrangement of the circuit devices in the structure of FIGS. 25 through 27.

FIGS. 25 through 27 are partial views of an electronic array structure 520 incorporating the line driver circuits 232 and 234 shown in FIG. 8. The remainder of the electronic structure 520 not shown in FIGS. 25 through 27 may be formed in a manner similar to that of the corresponding portions of electronic array 400 in FIGS. 16 and 17. The trigger threshold switches 236 and 238 may be formed at the same time and from the same layers of material as the main threshold switches 136 and 146. The bottom metal layer in structure 520 is patterned, as best depicted in FIG. 25, so as to form, among other things, three conductive pads 148, 422a and 422b, as well as address line 120. The conductive pad 422a serves as the conductor forming node 141 in line driver circuit 232, while the conductive pad 422b serves as the conductor forming node 151 in line driver circuit 234. The diode 138 is of opposite polarity to diode 148 with respect to the address line 120, but both diodes 138 and 148 are formed from the same layers of material. The diode 138 is located on conductive pad 422a, and connected it to address line 120 via a trace 145₁, that is created by patterning top metal layer 462. In contrast, the diode 148 is located on address line 120, and is connected to conductive pad 422*b* by a conductor or trace 155₁ also formed by patterning top metal layer 462. Using the foregoing arrangement of diodes and connecting traces, diodes 138 and 148 which have differing polarities with respect to address line 120 are formed with a minimal number of patterning steps.

Since the structures implementing the line driver circuits 232 and 234 are located on the same side of address line 120, they are preferably formed adjacent to one another. This may be accomplished, for example, by arranging such structures in a horizontal side-by-side relationship, or by arranging them in a vertical side-by-side relationship like that illustrated in FIG. 25. To minimize the amount of additional space which may be required in the vertical direction of FIG. 25 by the two circuit structures, the dimensions of these two line driver circuits has been increased in the horizontal direction and reduced in the vertical direction as best shown in FIG. 25. To compensate for any increased vertical dimension occupied by these two structures, the dimensions of the cell structures 60 of the array such as cell 60₁₁ may be increased in the vertical direction and decreased in the horizontal direction, provided the intended application for array permits this, to balance out the geometrical arrangement of the array. By employing appropriate layouts for arrays such as the layout shown in FIGS. 25 and 27, the placement of the line driver circuits on the same side of the address lines 120 need not have any substantial adverse affect upon the size or complexity of the electronic array 520.

Figure 29:
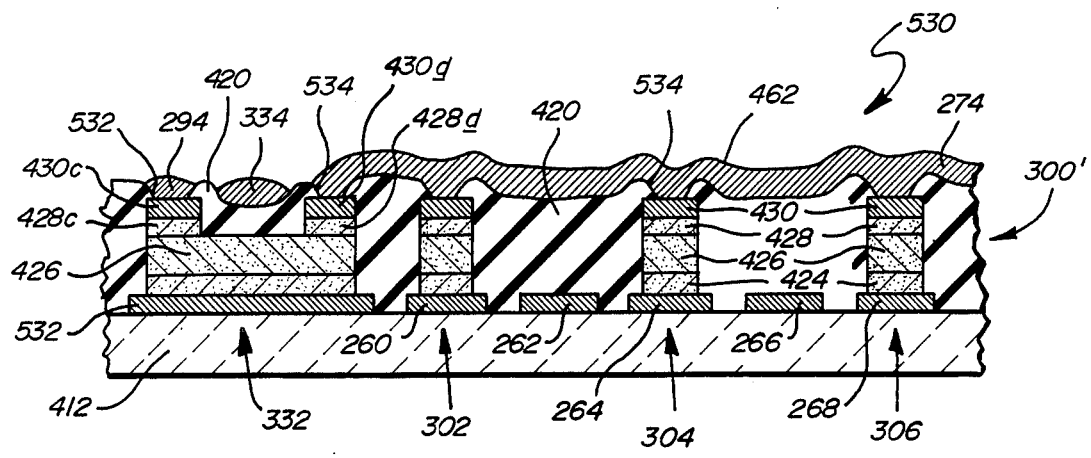
FIGS. 28 and 29 are plan and side views of a thin film structure implementing the integrated diode logic gate array shown in FIG. 10C, with FIG. 29 being taken along line 29—29 of FIG. 28.
Figure 28:
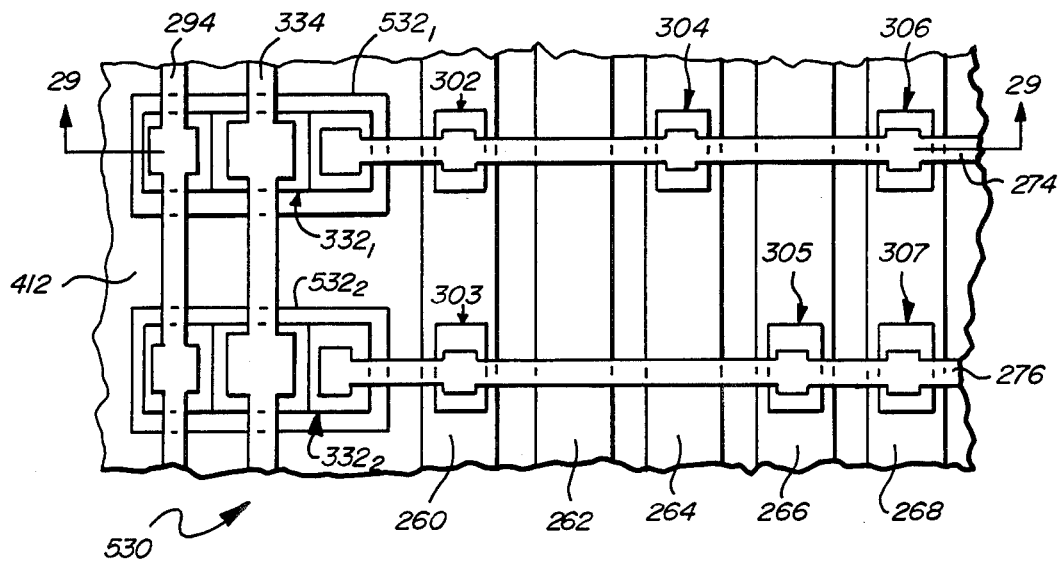

FIGS. 28 and 29 are partial views of a thin film integrated electronic structure 530 which represents one possible embodiment of the diode-based address decoding circuit 330 of FIG. 10C. One important advantage of structure 530 is that it may be constructed at the same time using the same layers of material as are used to create the thin film isolation diodes associated with each of the cells in a thin film electronic array such as the array 400 illustrated in FIGS. 16 and 17.

If desired, the sixth layer 432 may be omitted in favor of increasing the thickness of the metal layer 430 from sixty angstroms to about 1000 to 3000 angstroms. (Those in the art will appreciate that the sixth layer 432 is not required in thin film electronic arrays utilizing p-i-n diodes where the diodes are not subsequently covered by a material such as semiconductor memory material which is adversely affected by the composition of layer 430.) The diode mesa structures 302, 304 and 306, as well as the mesa structure on top of which is later formed transistor 332 may be produced by dry etching the upper four layers 424 through 430 at substantially the same time in the manner previously described with respect to the other diode arrays. The bottom metal layer 422 can then be subsequently photolithographically patterned to form the vertically arranged address select lines 260 through 268 as well as the conductive pads 532 upon which the mesa structure for the transistors 332 is disposed. Alternatively, the bottom metal layer 422 may be patterned before layers 424 through 430 are deposited.

In order to form the transistor 332, the two upper layers 428 and 430 photolithographically patterned into separate sections, one of which includes portions 428*c* and 430*c* and the other which includes portions 428*d* and 430*d*. These sections serve as the source and drain electrodes of the field effect transistor 332. Thereafter, insulating layer 420 is deposited and patterned so as to form vias above the diodes such as via 534 above diode 304, and to form vias 536 and 538 above the source and drain electrodes of transistor 332.

Next, the top metal layer 462 is deposited and patterned to form the row select lines 274 and 276 and the common lines 294 and 334 which extend between the transistor 332 in a vertical direction as shown in FIG. 28. The row select conductor 274 makes contact with the cathodes of diodes 302, 304 and 306 and one of the electrodes of the transistor 332₁. Row select conductor 276 connects to the anodes of diodes 303, 305 and 307, and to one of the electrodes of transistor 332₂. The conductor 294 brings the voltage source $V_{EE4}$ to the other electrodes of the transistors 332. The conductor 334 is appropriately patterned so as to serve as the gates of the field effect transistors 332, as well as the common conductor extending therebetween.

Figure 31:
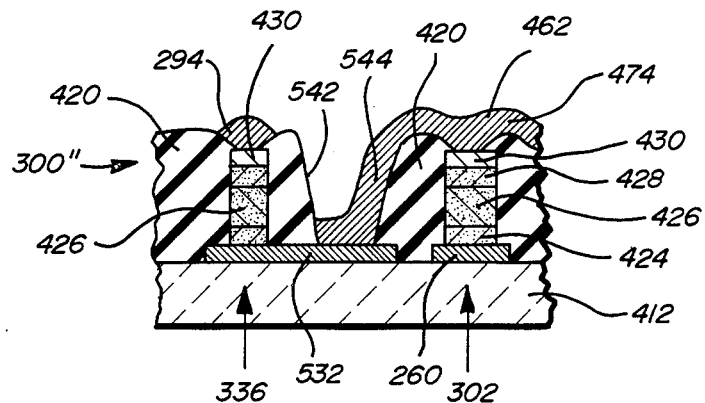
FIGS. 30 and 31 are partial plan and side views of a thin film structure implementing the diode logic gate array shown in FIG. 10D, with FIG. 31 being taken along line 31—31 of FIG. 30.
Figure 30:
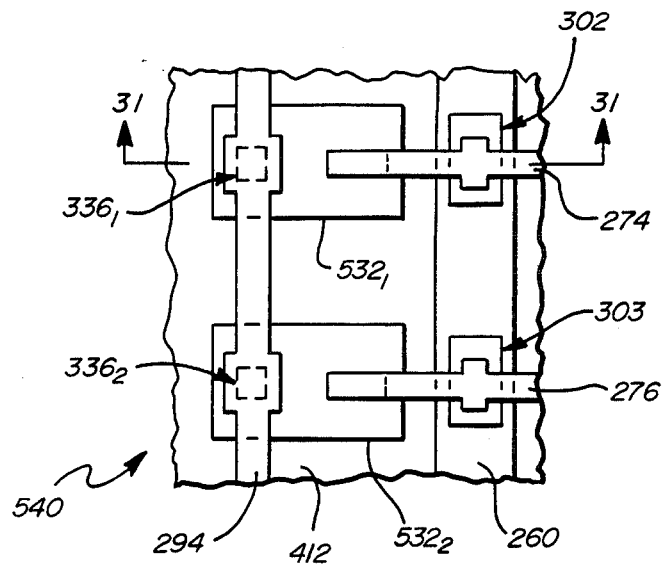

FIGS. 30 and 31 are partial views of a thin film integrated electronic structure 540 which represents a preferred embodiment of the all-diode address decoding circuit 335 of FIG. 10D. The remainder of the electronic structure 540 not shown in FIGS. 30 and 31 may be formed in a manner identical to that of the corresponding portions of address decoding circuit structure 530 shown in FIGS. 28 and 29. Structure 540 is formed with only one type of circuit device, namely diodes, which are preferably multilayer vertical diodes all patterned at the same time using the diode-forming techniques earlier described with respect to FIGS. 13 and 14. Structure 540 does conform any passive resistors, capacitors, transistors or the like. So once the diode mesa structures have been formed, no additional processing steps are required, except for depositing and patterning the top metal layer. Since fewer processing steps are required to construct structure 540 than are required with structure 530, it should be less expensive, and be producible with greater yields than structure 540.

The diode 336 in logic gate 300″ shown in FIG. 10D has its anode connected to row select line 274 while the other diodes of gate 300″ have their cathodes connected to row select line 274. Since all of the diodes in structure 540 are preferably formed from the same common large area thin film layers 422 through 430 by patterning them into mesa structures as illustrated in FIGS. 28-31, an opening or via 542 is formed in the insulating layer 420 to expose the conductive pad 532 so that a connection may be made to the anode of diode 336. Extending portion 544 of row select line 274 makes contact with conductive pad 532, thus forming a direct electrical connection between row select line 274 and the anode of diode 336. As previously explained, diode 336 may be made three to twenty times smaller than the other diodes of logic gate 300″ so that it offers considerably more resistance to current flow than the other diodes. Alternatively, diode 336 could be vertically made with a thicker intrinsic layer so that it would have more resistance, especially when forward-biased, even though it had the same cross-sectional area. This could be accomplished by forming diode 336 separately from the other diodes of logic gate 300″.

The address decoding circuit 252 of FIG. 10A which uses passive resistance elements, such as resistor 308, may also readily be implemented in a thin film form. Such a thin film structure may closely resemble the thin film structure 530 of FIGS. 28 and 29, with the exception that the passive resistive elements 308 would be used in place of the active resistive elements 332. Such passive resistive elements could be fabricated in a variety of ways known to those in the thin film microelectronics art, such as by using a patterned strip of metal having a controlled conductance, such tantalum into which a controlled amount of oxygen has been diffused or ion implanted, or by using a patterned portion of the n+ layer 428 between two spaced apart electrodes which make ohmic contact with the n+ layer.

Figure 32:
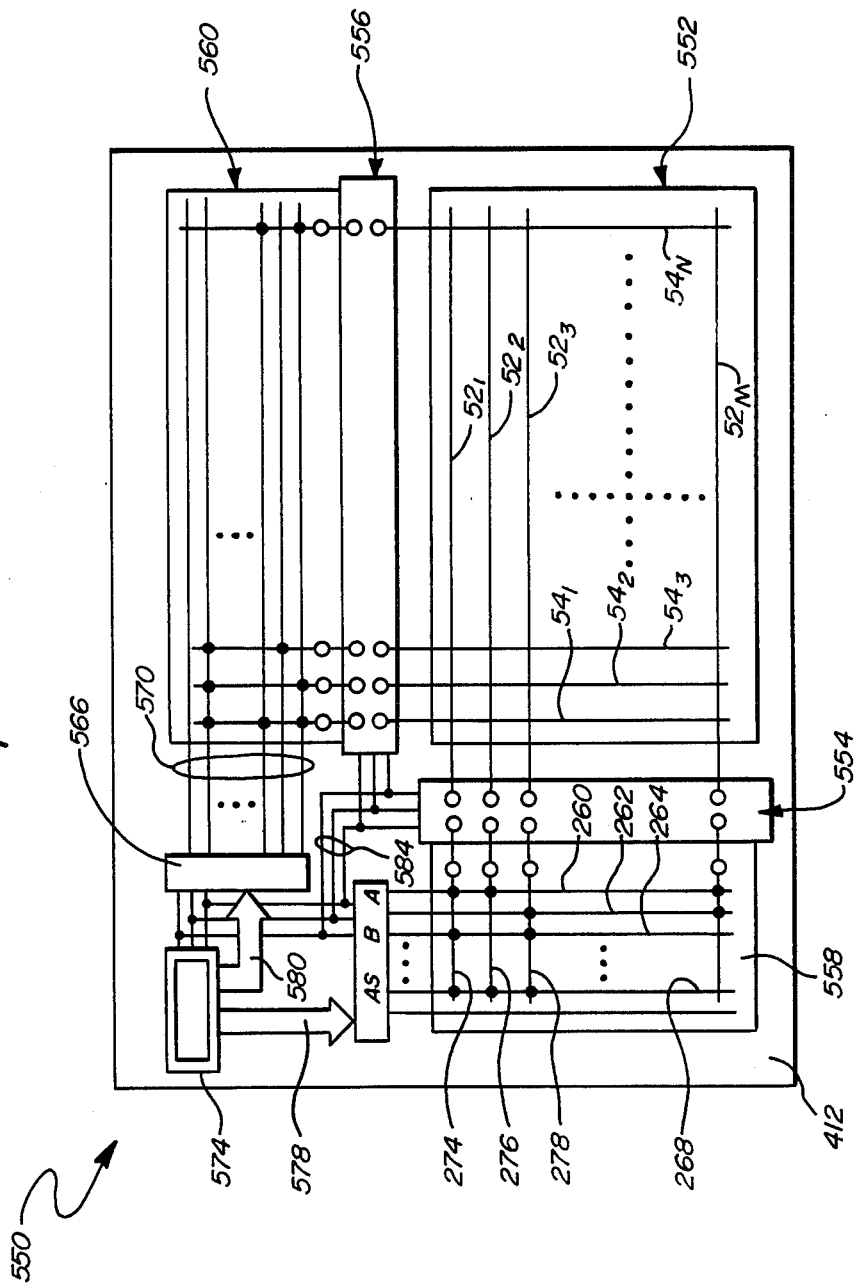
FIG. 32 is a simplified plan view of an electronic array of the present invention incorporating a matrix array of addressable cells, line driver circuits, and integrated diode logic gate arrays all formed in integrated fashion on the same substrate.

FIG. 32 illustrates in block diagram form one possible arrangement of a fully integrated electronic array of the present invention. The integrated array 550 includes an array 552 of cells which are preferably accessible by electrical signals applied to plural sets of conductors or address lines 52 and 54, with at least one conductor from each of the set 52 and 54 connected to each cell. The array 552 also includes at least one group or array 554 of line driver circuits and preferably a second group or array 556 of line driver circuits. These groups of arrays are preferably respectively connected to the first and second sets 52 and 54 of address lines, as shown. Array 550 also preferably includes one group or array 558 of thin film electronic devices connected together to form an integrated address decoding circuit to service the first line driver array 554, and preferably includes a second such array 560 to service the second line driver array 556.

The integrated array 550 may also include first and second address generation means 564 and 556 for providing signals on conductor sets or buses 568 and 570 respectively which control the operation of address decoding circuits 558 and 560. The address generation means 564 and 566 may take the form of thin film circuits as well, or they may alternatively be integrated circuit chips widely used in the crystalline semiconductor industry for generating suitable addressing signals useful in accessing electronic arrays. Such address generation means may, for example, provide addresses in a manner that allows random accessing of cells within the array 552. Alternatively, they may provide may signals for accessing the cells of array 552 in a predetermined substrate such as a row at a time in descending order as is often done for flat panel displays. Control signals for supervising the operation of address generation means 564 and 566 may be conventionally provided such as by a ribbon connector socket assembly 574 which is attached to the substrate and interconnected to the chips 564 and 566 via buses 578 and 580 respectively. Power for operating the electronic array 552 may also be conventionally provided such as through connector 574. The power may be distributed to the various arrays 554 through 560 and circuits 564 and 566 via metal conductors 584 which are preferably formed on the substrate prior to or concurrently with the formation of the thin film arrays.

The array 552 of cells may be any thin film electronic array having a plurality of multiple locations or cells which need to be periodically accessed electric signals or waveforms applied to the cells such as though via two or more conductors such as address lines 52 and 54. The array 552 of cells may, for example, take the form of any of the prior art electronic arrays discussed with respect to FIGS. 1 through 3 in the background portion of the invention. Array 552 may also take the form of the electronic memory matrix array shown and described with respect to FIGS. 16 and 17.

The arrays 554 and 556 of line drivers may take the form of any of the line driver circuits shown and described with respect to FIGS. 4 through 9 and FIG. 12. Any equivalent array incorporating a line driver circuit utilizing a threshold switch hereafter created to charge or discharge address lines could also be used in the arrays 554 and 556. The line driver circuits in arrays 554 will not necessarily to be identical to those utilized in array 556. For example, the voltages or waveforms which are applied to the column lines of a particular electronic matrix may and typically will differ in amplitude, timing, and even basic waveform shape from those utilized with respect to the row lines. If desired, the line driver circuits of the present invention may be used in an array 554, while some other form of line driving circuit, perhaps a linear amplifier circuit such as those used for applying gray-scale video drive signals used with flat panel displays may be used to provide the waveform supplied to the second set of address lines 54 of array 552. Some thin film memory arrays described in the aforementioned U.S. patents disclose memory arrays requiring distinctly different voltage levels and waveforms for setting or writing to the programmable cells, as compared to the reading of such cells. Thus, it is expected that two different sets of line driving circuits of the present invention each producing different voltage levels or waveforms, may be connected to a single set of address lines to provide such different voltages or waveforms for setting cells and for reading cells.

In light of the foregoing, it should be appreciated that the integrated electronic array structure 550 may be used directly or readily adapted so as to form an integrated electronic array, used as a memory array, such as a RAM, EEPROM, or read only memory (ROM), or as an integrated electronic array for flat panel displays incorporating light influencing materials or light emitting cells therein, or as an integrated photosensitive array useful for imaging or scanning purposes, such as the imaging or scanning of documents, maps, drawings and the like.

An important advantage of the line driver circuit structures of the present invention is that they may be constructed from continuous large area multiple layers of thin film material which are patterned thereafter into distinct devices and circuits in an efficient manner, so as to form vertical devices, instead of horizontal devices. In vertical devices, the current passing therethrough generally flows between first and second vertically displaced electrodes. The amount of area required per vertical device is typically considerably less than that required for a similar horizontal device, where the current flows generally horizontally between electrodes. Thus the substrate area required to implement a circuit is dramatically reduced, as is the complexity of fabricating such devices. This inherently higher density of vertical device structures allows thin film circuits made from such devices to be formed using larger minimum feature sizes than if corresponding horizontal structures were used. Larger minimum feature size increases registration tolerances and reduces fabrication costs. These factors in turn contribute to higher yields in thin film circuit structures made from vertical devices.

The thin film structures for the threshold devices, isolation devices such as diodes, memory cells, capacitors and nonlinear switching devices usually have been shown and described herein principally as vertical devices. Those in the art will appreciate that the devices used in the present invention generally can be implemented in horizontal form using individual horizontal device structures known to those in the thin film microelectronics art.

Although most of the Figures herein illustrate horizontally arranged lines or row conductors, it will be appreciated that the circuits and structures may be readily adapted for use with column conductor or other switched conductors of an electronic array. Also, fabrication steps for the circuits, devices and layers have been generally described with respect to a first line, such as line 52, in the array or circuit being described. Those in the art will appreciate that the circuits, devices and layers associated with the other lines of an $M \times N$ array or large circuit may be constructed in the same basic manner as those described with respect to the first line of the array or circuit. Moreover, as will be readily appreciated, each processing step is preferably carried out, where practical and useful to do so, over the entire electronic structure or structures being fabricated on a single substrate. This may be done well-known batch process fashion, for example, and helps minimize the number of processing steps required to fabricate the desired structure or structures.

The line driver circuits of the present invention have been described in the foregoing embodiments as being made using vertical threshold switches, which are devices having: (1) a negative resistance characteristic, (2) a threshold voltage at which they switch from a high resistance off condition to a low resistance on condition, and (3) a minimum holding current or voltage below which the switch reverts to its high resistance off condition. However, any other thin film devices which exhibit similar characteristics may be utilized in place of the threshold devices described and shown in the Figures and are considered to be within the scope of the present invention.

The line drivers herein have also been described above with reference to thin film non-single-crystal semiconductor devices and structures. Those in the art will appreciate that the line driver circuits of the present invention may be incorporated in hybrid thin film crystalline semiconductor arrays if desired, using thin film threshold switches built, for example, on top of a crystalline wafer or chip containing the electronic array whose lines are to be driven. Advantages of such a hybrid structure over using a crystalline power device such as a power MOSFET is that thin film threshold devices are generally easy to fabricate, are very rugged, exhibit higher current densities than crystalline silicon power devices, and can save space by being built above other circuits in the crystalline wafer, if desired.

Those skilled in the art should appreciate that the present invention can be practiced otherwise than as specifically disclosed herein. The present invention is susceptible to modification, variation and change without departing from the scope of the appended claims.

We claim:

1. An electronic matrix display array adapted for light influencing information display, said electronic matrix display array having a plurality of integrated picture elements and intersecting, multiple x and y address lines, each of said picture elements being located at the intersection of an x address line and a y address line and adapted to be repetitively accessed, said matrix array comprising:
   (a) a first x address line electrically connected to one set of picture elements;
   (b) line driver means for changing an electrical condition of said first x address line from a first nominal level to a second nominal level on the application of an electrical signal, and from the second nominal level back to the first nominal level when the electrical signal is removed and the second nominal level has been achieved, said line driver means including:
      (i) an integrated thin film x address line threshold switching device having a threshold voltage and a negative resistance characteristic and being switchable between a high resistance off state and a relatively lower resistance on state by the application of an x address line electrical signal above the threshold voltage of the x address line threshold switch across the x address line threshold switch and from the lower resistance on state to the high resistance off state when the first electrical signal is below the threshold voltage of the x address line threshold switch;
      (ii) isolation means electrically connected between said first x address line and said x address line integrated thin film threshold switching device for inhibiting the reverse flow of current between said threshold switching device and said x address line when said threshold switching device is in its off state; and
      (iii) trigger means associated with said x address line threshold switching device for providing said electrical signals in response to control signals received by said trigger means;
   (c) a first y address line electrically connected to one set of picture elements; and
   (d) line driver means for changing an electrical condition of said first y address line from a first nominal level to a second nominal level on the application of an electrical signal, and from the second nominal level back to the first nominal level when the electrical signal is removed and the second nominal level has been achieved, said line driver means including:
      (i) a y address line integrated thin film threshold switching device having a threshold voltage and a negative resistance characteristic and being switchable between a high resistance off state and a relatively lower resistance on state by the application of a y address line electrical signal above the threshold voltage of the y address line threshold switch across the y address line threshold switch and from the lower resistance on state to the high resistance off state when the y address line electrical signal is below the threshold voltage of the y address line threshold switch;
      (ii) isolation means electrically connected between said first y address line and said y address line integrated thin film threshold switching device for inhibiting the reverse flow of current between said threshold switching device and said y address line when said threshold switching device is in its off state; and
      (iv) trigger means associated with said y address line threshold switching device for providing said electrical signals in response to control signals received by said trigger means.

2. An electronic array as defined in claim 1 wherein said isolation means includes a rectifying junction.

3. An electronic array as in claim 2 wherein said isolation means include a diode containing said rectifying junction.

4. An electronic array as in claim 1 wherein said threshold switching material is formed of an amorphous semiconductor material.

5. An electronic array as in claim 1 wherein said line driver means includes trigger means associated with said threshold switching device, for providing said trigger event to said threshold switching device in response to at least one control signal received by said trigger means.

6. An electronic array as in claim 5 wherein said trigger means is a thin film device integrally formed with said threshold switching device above a common substrate.

7. An electronic array as in claim 5 wherein said trigger means includes a transistor.

8. An array as in claim 5 wherein said trigger means includes a capacitor.

9. An electronic array as in claim 5 wherein said trigger means is a two terminal nonlinear device.

10. An electronic array as in claim 9 wherein said two terminal nonlinear device is a diode.

11. An electronic array as in claim 9 wherein said two terminal nonlinear device includes a semiconductor body having first, second and third regions, wherein said first and third regions are of a first conductivity type and are separated from one another by said second region which is of a second conductivity type distinct from said first conductivity type.

12. An electronic array as in claim 1 wherein said threshold switching device is formed from regions of thin film material, said thin film regions including an active region of said threshold switching material and plural spaced apart regions of relatively inert highly conductive material disposed adjacent to said active region, said plural spaced regions each forming at least part of one of said plural electrodes.

13. An electronic array as in claim 12 wherein said regions of thin film material comprise a plurality of layers stacked one upon the other.

14. An electronic array as in claim 13 wherein said plural spaced apart regions are vertically displaced with respect to one another, thereby forming a threshold device having a substantially vertical conduction path through said active region of said threshold switching material.

15. An electronic array as in claim 12 wherein said plural regions of relatively inert highly conductive material each include thin film carbon disposed directly adjacent said active region of threshold switching material.

16. An electronic device as in claim 15 wherein said carbon film is substantially amorphous.

17. An electronic array as in claim 15 wherein said carbon film is less than 2000 angstroms thick.

18. An electronic array as in claim 17 wherein said carbon film is less than 200 angstroms thick.

19. An electronic array as in claim 1 further comprising:
addressing circuit means for providing said trigger event to said threshold switching device in response to a preselected pattern of electric signals received by said addressing circuit means.

20. An electronic array as in claim 19 wherein said addressing circuit means includes an integrated address decoding circuit including a combinational logic gate having a plurality of inputs.

21. An electronic array as in claim 20 wherein said combinational logic gate is a diode logic gate formed from a plurality of thin film vertical diodes, and said preselected pattern is composed of a plurality of signals applied concurrently to said inputs.

22. An electric matrix display array adapted for light influencing information display, said electronic matrix display array having a plurality of integrated picture elements and intersecting, multiple x and y address lines, each of said picture elements being located at the intersection of an x address line and a y address line and adapted to be repetitively accessed, said matrix array comprising:

(a) a first x address line electrically connected to one set of picture elements;

(b) line driver means for changing an electrical condition of said first x address line from a first nominal level to a second nominal level on the application of an electrical signal, and from the second nominal level back to the first nominal level when the electrical signal is removed and the second nominal level has been achieved, said line driver means including:

(i) a first integrated thin film x address line threshold switching device having a threshold voltage and a negative resistance characteristic and being switchable between a high resistance off state and a relatively lower resistance on state by the application of a first x address line electrical signal above the threshold voltage of the first x address line threshold switch across the first x address line threshold switch and from the lower resistance on state to the high resistance off state when the first electrical signal is below the threshold voltage of the first x address line threshold switch;

(ii) a second integrated thin film x address line threshold switching device having a threshold voltage and a negative resistance characteristic and being switchable between a high resistance off state and a relatively lower resistance on state by the application of a second x address line electrical signal above the threshold voltage of the second x address line threshold switch across the second x address line threshold switch and from the lower resistance on state to the high resistance off state when the second x address line electrical signal is below the threshold voltage of the second address line threshold switch;

(iii) isolation means electrically connected between said first x address line and each of said first and second x address line integrated thin film threshold switching devices for inhibiting the reverse flow of current between one of said threshold switching devices and said x address line when said threshold switching device is in its off state;

(iv) trigger means associated with said first x address line threshold switching device and said second x address line threshold switching device for providing said electrical signals in response to control signals received by said trigger means, and wherein said first nominal level is of one polarity and said second nominal level is a negative voltage whereby alternating polarities are applied to said x address line by alternate operation of said first x address line threshold switch means and said second x address line threshold switch means;

(c) a first y address line electrically connected to one set of picture elements; and (d) line driver means for changing an electrical condition of said first y address line form a first nominal level to a second nominal level on the application of an electrical signal, and from the second nominal level back to the first nominal level when the electrical signal is removed and the second nominal level has been achieved, said line driver means including:

(i) a first y address line integrated thin film threshold switching device having a threshold voltage nad a negative resistance characteristic and being switchable between a high resistance off state and a relatively lower resistance on state by the application of a first y address line electrical signal above the threshold voltage of the first y address line threshold switch across the first y address line threshold switch and from the lower resistance on state to the high resistance off state when the first y address line electrical signal is below the threshold voltage of the first y address line threshold switch;

(ii) a second y address line integrated thin film threshold switching device having a threshold voltage and a negative resistance characteristic and being switchable between a high resistance off state and a relatively lower resistance on state by the application of a second y address line electrical signal above the threshold voltage of the second y address line threshold switch across the second y address line threshold switch across the second y address line threshold switch and from the lower resistance on state to the high resistance off state when the second y address line electrical signal is below the threshold voltage of the second y address line threshold switch;

(iii) isolation means electrically connected between said first y address line and each of said first and second y address line integrated thin film threshold switching devices for inhibiting the reverse flow of current between one of said threshold switching devices and said y address sline when said threshold switching device is in its off state; and (iv) trigger means associated with said first y address line threshold switching device and said second y address line threshold switching device for providing said electrical signals in response to control signals received by said trigger means, and wherein said first nominal level is of one polarity and said second nominal level is of opposite polarity whereby alternating polarities are applied to said y address line by alternate operation of said first y address line threshold switch means and said second y address line threshold switch means.

23. An electronic matrix display array as defined in claim 22, wherein said isolation means includes a rectifying junction.

24. An electronic matrix display array as in claim 23, wherein said isolation means include a diode containing said rectifying junction.

25. An electronic matrix display array as in claim 22, wherein said threshold switching material is formed of an amorphous semiconductor material.

26. An electronic matrix display array as in claim 22, wherein said trigger means is a thin film device integrally formed with said threshold switching device above a common substrate.

27. An electronic matrix display array as in claim 26, wherein said trigger means includes a transistor.

28. An electronic matrix display array as in claim 26 wherein said trigger means includes a capacitor.

29. An electronic matrix display array as in claim 26, wherein said trigger means is a two terminal nonlinear device.

30. An electronic matrix display array as in claim 29, wherein said two terminal nonlinear device is a diode.

31. An electronic matrix display array as in claim 29, wherein said two terminal nonlinear device includes a semiconductor body having first, second and third regions, wherein said first and third regions are of a first conductivity type and are separated from one another by said second region which is of a second conductivity type distinct from said first conductivity type.

32. An electronic matrix display array as in claim 22, wherein said threshold switching devices are formed from regions of thin film material, said thin film regions including an active region of said threshold switching material and plural spaced apart regions of relatively inert highly conductive material disposed adjacent to said active region, said plural spaced regions each forming at least part of one of said plural electrodes.

33. An electronic matrix display array as in claim 32, wherein said regions of thin film material comprise a plurality of layers stacked one upon the other.

34. An electronic matrix display array as in claim 33, wherein said plural spaced apart regions are vertically displaced with respect to one another, thereby forming a threshold device having a substantially vertically conduction path through said active region of said threshold switching material.

35. An electronic matrix display array as in claim 32, wherein said plural regions of relatively inert highly conductive material each include thin film carbon disposed directly adjacent said active region of threshold switching material.

36. An electronic device as in claim 35, wherein said carbon film is substantially amorphous.

37. An electronic array as in claim 35, wherein said carbon film is less than 2000 angstroms thick.

38. An electronic array as in claim 32, wherein said carbon film is less than 200 angstroms thick.

39. An electronic matrix display array as in claim 22, further including: addressing circuit means for providing said trigger event to said threshold swithing device in response to a preselected pattern of electric signals received by said addressing circuit means.

40. An electronic matrix display array as in claim 39, wherein said addressing circuit means includes an integrated address decoding circuit including a combinational logic gate having a plurality of inputs.

41. An electronic matrix display array as in claim 40, wherein said combinational logic gate is a diode logic gate formed from a plurality of thin film vertical diodes, and said preselected pattern is composed of a plurality of signals applied concurrently to said inputs.

* * * * *